(12) United States Patent
Takahashi et al.

(10) Patent No.: US 8,783,835 B2
(45) Date of Patent: Jul. 22, 2014

(54) PIEZOELECTRIC ELEMENT, LIQUID EJECTING HEAD, AND LIQUID EJECTING APPARATUS

(75) Inventors: Toshiaki Takahashi, Chino (JP); Tomohiro Sakai, Chino (JP)

(73) Assignee: Seiko Epson Corporation, Tokyo (JP)

( * ) Notice: Subject to any disclaimer, the term of this patent is extended or adjusted under 35 U.S.C. 154(b) by 87 days.

(21) Appl. No.: 13/297,176

(22) Filed: Nov. 15, 2011

(65) Prior Publication Data
US 2012/0120162 A1    May 17, 2012

(30) Foreign Application Priority Data

Nov. 16, 2010  (JP) .................................. 2010-256347
Sep. 28, 2011  (JP) .................................. 2011-213542

(51) Int. Cl.
*B41J 2/045* (2006.01)

(52) U.S. Cl.
USPC .......................................................... 347/68

(58) Field of Classification Search
None
See application file for complete search history.

(56) References Cited

U.S. PATENT DOCUMENTS

2007/0241642 A1*  10/2007  Miyazawa et al. ............. 310/358
2010/0231095 A1*   9/2010  Kubota et al. ................. 310/357

FOREIGN PATENT DOCUMENTS

| JP | 2001-223404 | 8/2001 |
| JP | 2007-287745 | 11/2007 |
| JP | 2009-242229 | 10/2009 |
| JP | 2009-252789 | 10/2009 |

* cited by examiner

*Primary Examiner* — Matthew Luu
*Assistant Examiner* — Erica Lin
(74) *Attorney, Agent, or Firm* — Workman Nydegger

(57) ABSTRACT

A piezoelectric element comprises a piezoelectric layer and electrodes provided to the piezoelectric layer. The piezoelectric layer has a perovskite structure that includes Bi, Fe, Ba, Ti, and Co, and the mole ratio of Co to the total amount of Co and Fe is 0.02 or more and 0.07 or less.

6 Claims, 25 Drawing Sheets

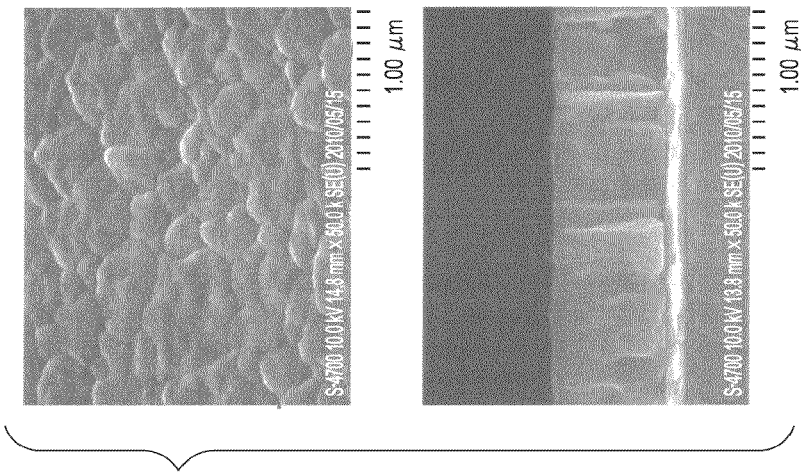
FIG. 11A   FIG. 11B   FIG. 11C
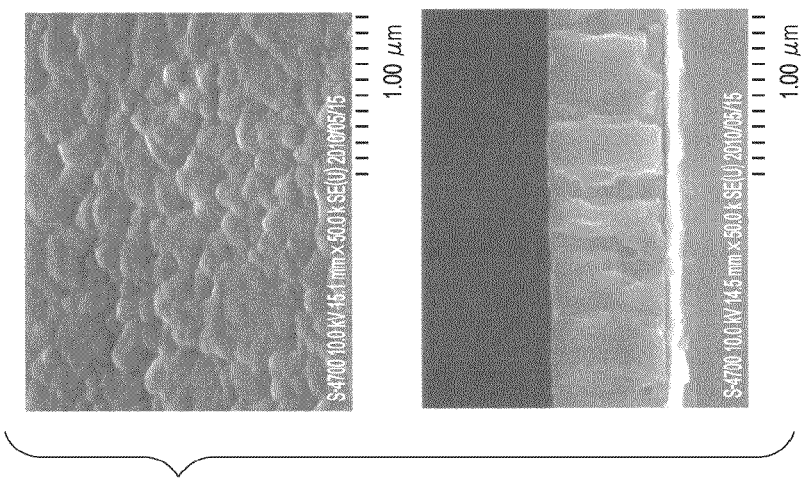
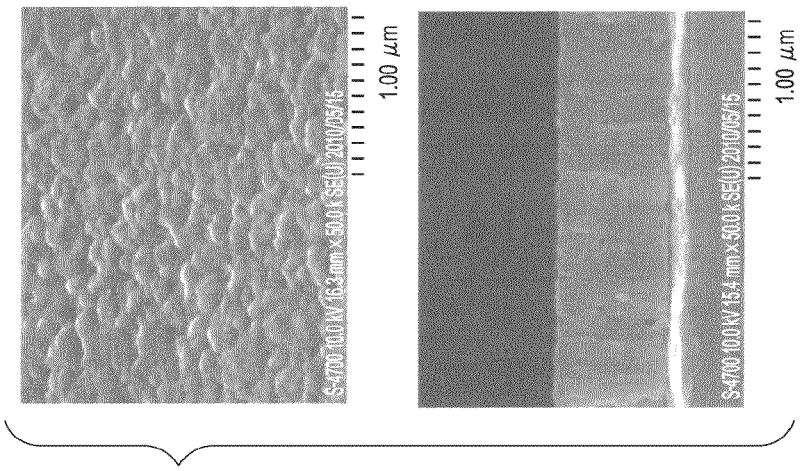

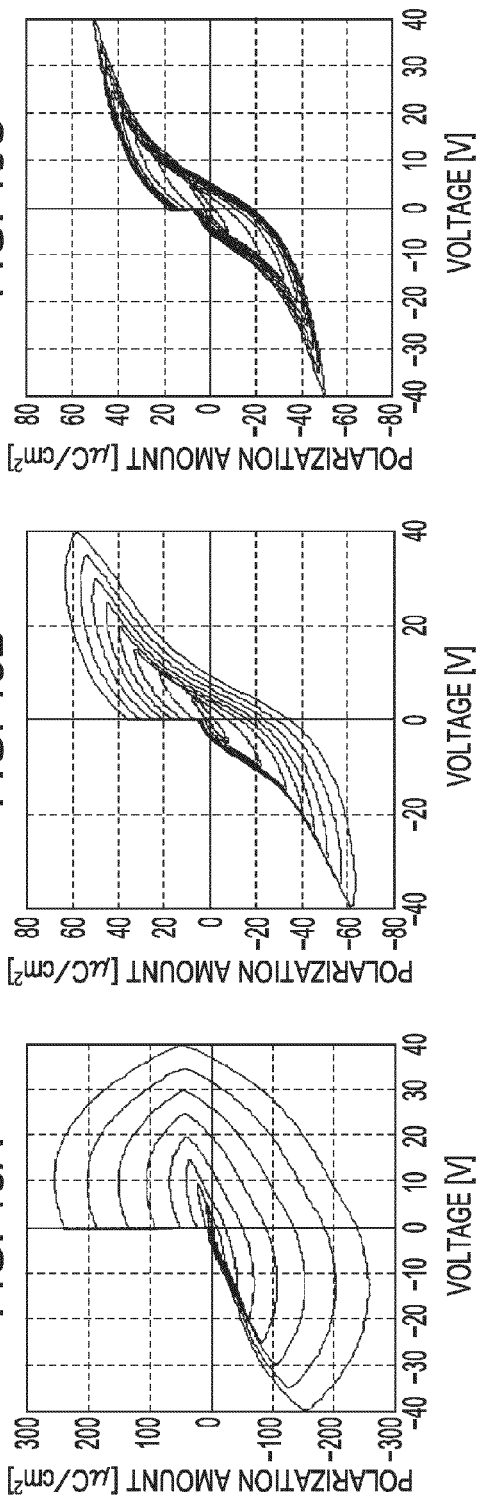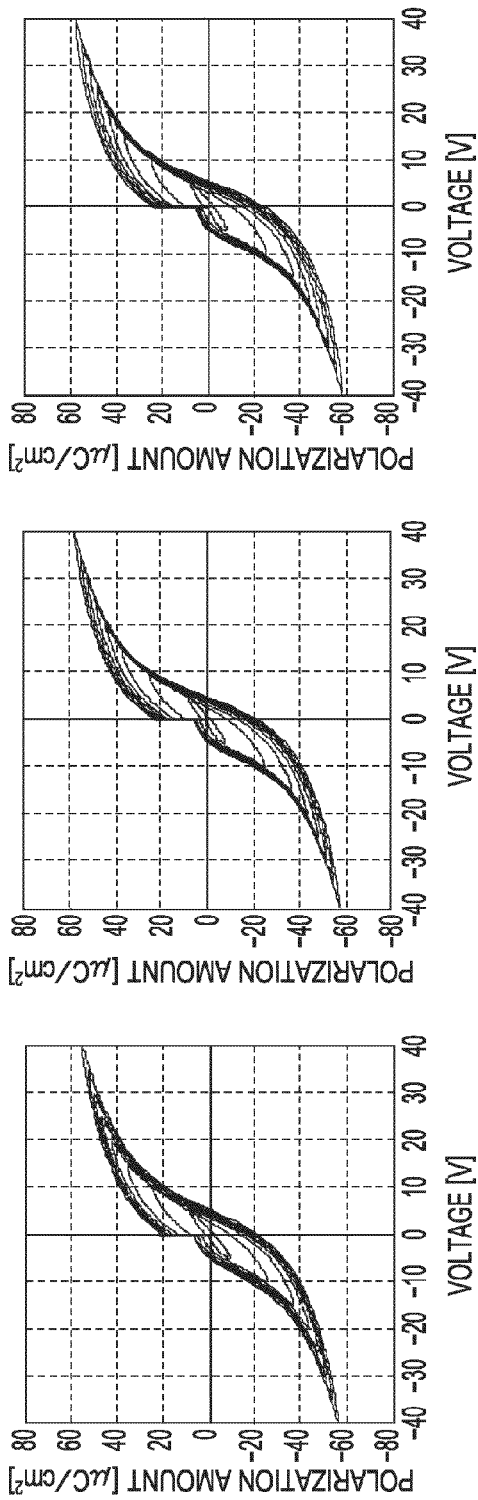

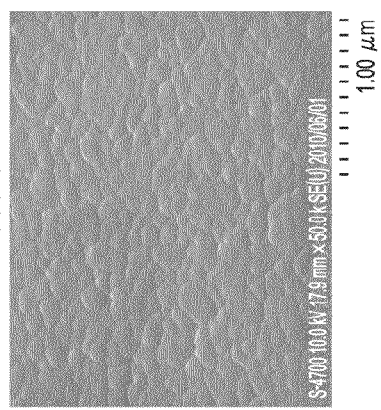
FIG. 16A
COMPARISON FILM BF-BT
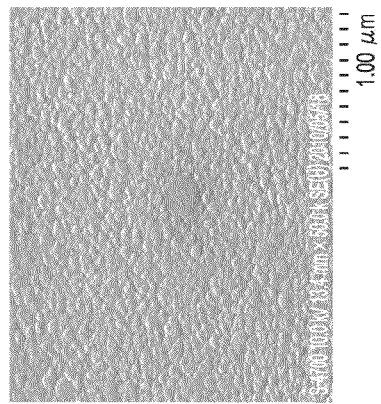
FIG. 16B
500°C
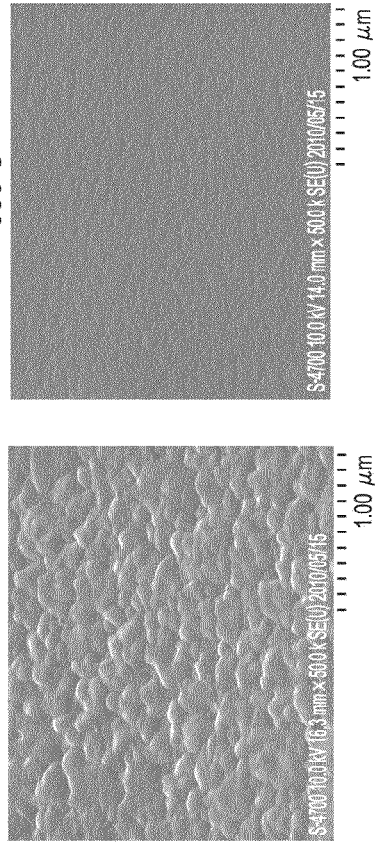
FIG. 16C
600°C
FIG. 16D
680°C
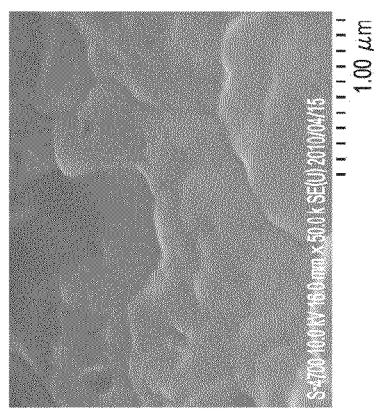
FIG. 16E
700°C
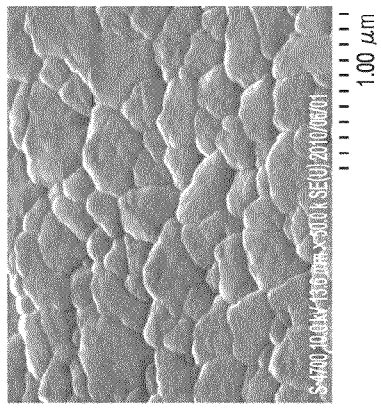
FIG. 16F
750°C
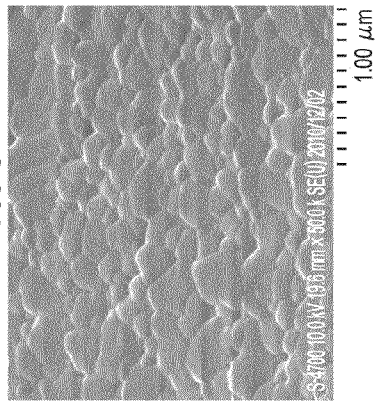
FIG. 16G
780°C
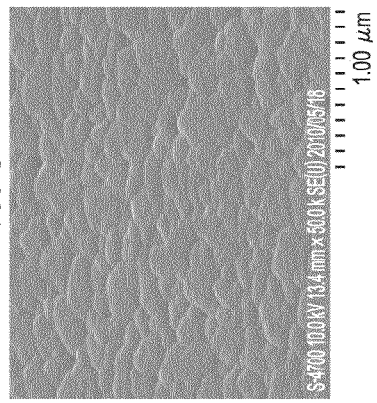
FIG. 16H
830°C

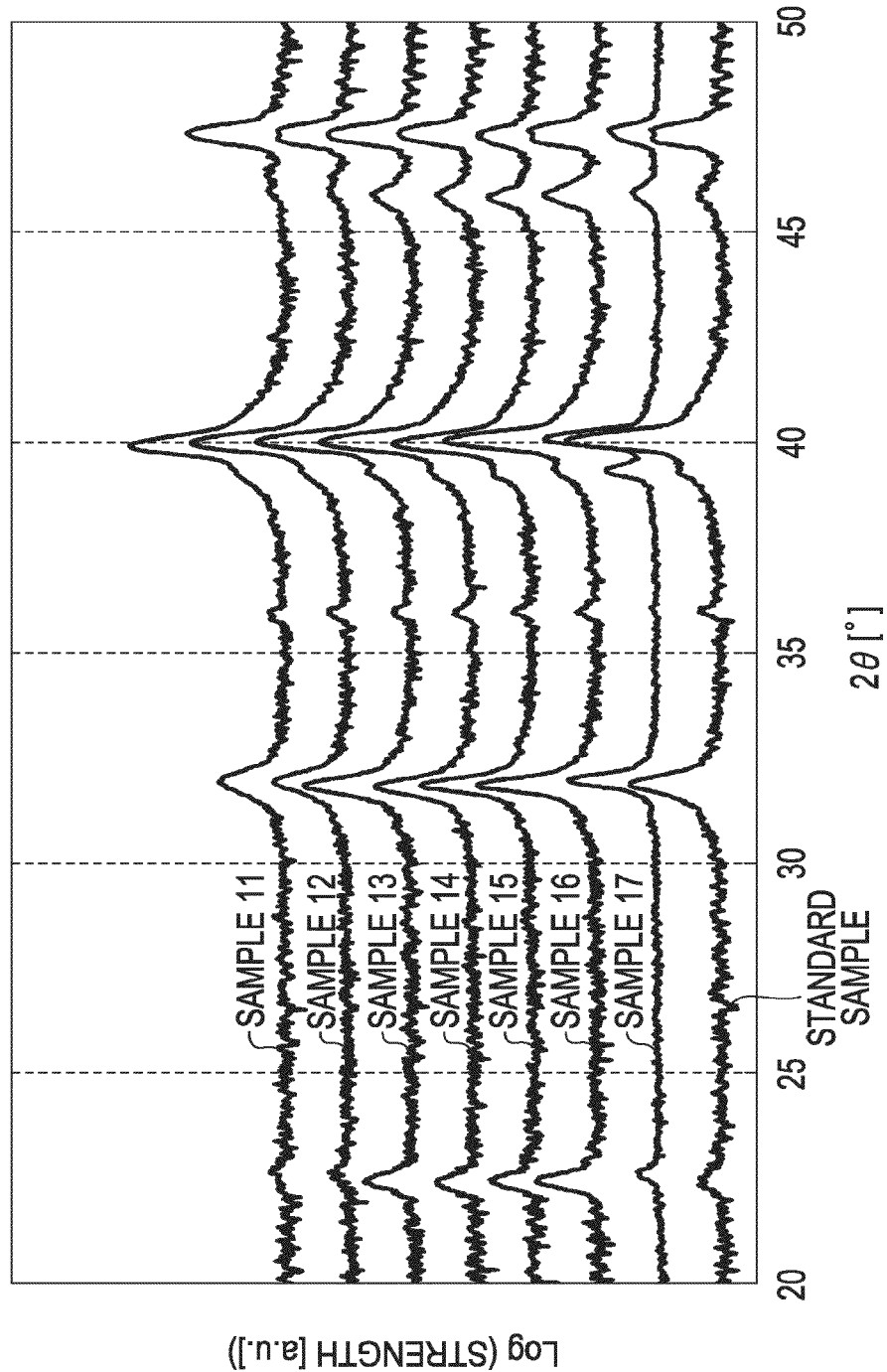

PIEZOELECTRIC ELEMENT, LIQUID EJECTING HEAD, AND LIQUID EJECTING APPARATUS

CROSS-REFERENCE TO RELATED APPLICATIONS

The entire disclosure of Japanese Patent Application No. 2010-256347, filed Nov. 16, 2010 and Japanese Patent Application No. 2011-213542, filed Sep. 28, 2011 are expressly incorporated by reference.

BACKGROUND

1. Technical Field

The present invention relates to a liquid ejecting head which alters the pressure in pressure-generating chambers communicated to nozzle openings and is equipped with piezoelectric elements having piezoelectric layers and electrodes that apply voltages to the piezoelectric layers, a liquid ejecting apparatus, a piezoelectric element, and a piezoelectric material.

2. Related Art

There is a piezoelectric element configured to pinch a piezoelectric material exhibiting an electromechanical transduction function, for example, a piezoelectric layer (piezoelectric film) composed of a crystallized dielectric material, between two electrodes. Such a piezoelectric element is mounted in, for example, a liquid ejecting head as an actuator apparatus in a bending vibration mode. Typical examples of the liquid ejecting head include an ink jet-type recording head in which a part of the pressure-generating chambers communicated to the nozzle openings that discharge ink droplets is composed of a vibrating plate, and the vibrating plate is deformed by a piezoelectric element so that the ink in the pressure-generating chambers is pressurized and discharged as ink droplets from the nozzle openings.

Piezoelectric materials used as the piezoelectric layer composing the piezoelectric element need to have high piezoelectric characteristics, and the typical examples include lead zirconate titanate (PZT) (refer to JP-A-2001-223404).

However, there is demand for a piezoelectric material to have a suppressed content of lead from the viewpoint of environment issues. Examples of the piezoelectric materials containing no lead include $BiFeO_3$-based piezoelectric materials containing Bi and Fe. Specific examples include piezoelectric materials represented by $(Bi_{1-x},Ba_x)(Fe_{1-x},Ti_x)O_3$, $(0<x<1)$ (refer to JP-A-2007-287745).

SUMMARY

The piezoelectric layer composed of such a piezoelectric material has a problem in that cracks are liable to occur and grow therein. Particularly, cracks become liable to occur or grow as time passes after the piezoelectric layer is manufactured. Of course, such a problem is similarly present even in other liquid ejecting heads that discharge liquid droplets other than ink as well as the ink jet-type recording head that discharges ink.

The invention has been made in consideration of these circumferences, and an advantage of some aspects of the invention is to provide a liquid ejecting head having a piezoelectric layer in which the occurrence or growth of cracks is suppressed, a liquid ejecting apparatus, a piezoelectric element, and a piezoelectric material.

A first aspect of the invention for solving the above problem is a liquid ejecting head equipped with pressure-generating chambers communicated to nozzle openings, and piezoelectric elements provided with piezoelectric layers and electrodes in the piezoelectric layers, in which the piezoelectric layer is a complex oxide having a perovskite structure that includes Bi, Fe, Ba, Ti, and Co, and a Co/(Co+Fe) ratio, which is the mole ratio of Co to the total amount of Co and Fe, of 0.02 to 0.07.

In this aspect, the occurrence or growth of cracks can be suppressed in the piezoelectric layer by using the piezoelectric material made of the complex oxide having the perovskite structure that includes Bi, Fe, Ba, Ti, and a predetermined amount of Co as the piezoelectric layer.

In addition, the Co/(Co+Fe) ratio is preferably 0.02 to 0.05. According to this, occurrence of leak current can be suppressed.

In addition, the Co/(Co+Fe) ratio is preferably 0.05 to 0.07. According to this, the strain tolerance amount can be increased.

In addition, it is preferable that the complex oxide further include Mn. According to the above, the leak characteristics can be further increased.

A second aspect of the invention is a liquid ejecting apparatus equipped with the liquid ejecting head of the first aspect. In this aspect, the liquid ejecting apparatus has the piezoelectric layers in which the occurrence or growth of cracks is suppressed, and therefore the liquid ejecting apparatus is excellent in terms of reliability.

In addition, a third aspect of the invention is a piezoelectric element equipped with a piezoelectric layer and electrodes provided in the piezoelectric layer, in which the piezoelectric layer is a complex oxide having a perovskite structure that includes Bi, Fe, Ba, Ti, and Co, and a Co/(Co+Fe) ratio, which is the mole ratio of Co to the total amount of Co and Fe, of 0.02 to 0.07. According to this, the occurrence or growth of cracks can be suppressed in the piezoelectric layer by using the piezoelectric material composed of the complex oxide having the perovskite structure that includes Bi, Fe, Ba, Ti, and a predetermined amount of Co as the piezoelectric layer. In addition, since the content of lead is suppressed, the environmental load can be reduced.

In addition, a fourth aspect of the invention is a piezoelectric material which is a complex oxide having a perovskite structure that includes Bi, Fe, Ba, Ti, and Co, in which the Co/(Co+Fe) ratio, which is the mole ratio of Co to the total amount of Co and Fe, is 0.02 to 0.07. According to this, the occurrence or growth of cracks can be suppressed by composing the piezoelectric material of the complex oxide having the perovskite structure that includes Bi, Fe, Ba, Ti, and a predetermined amount of Co as the piezoelectric layer.

BRIEF DESCRIPTION OF THE DRAWINGS

The invention will be described with reference to the accompanying drawings, wherein like numbers reference like elements.

FIGS. 11A to 11F are photographs of the surfaces and cross-sections of the piezoelectric layers observed using a SEM.

FIGS. 13A to 13F are views showing P-V curves.

FIGS. 16A to 16H are photographs of the surface and cross section of a piezoelectric layer which are observed using a SEM.

FIG. 17 is a view showing an X-ray diffraction pattern.

DESCRIPTION OF EXEMPLARY EMBODIMENTS

First Embodiment

Figure 1:
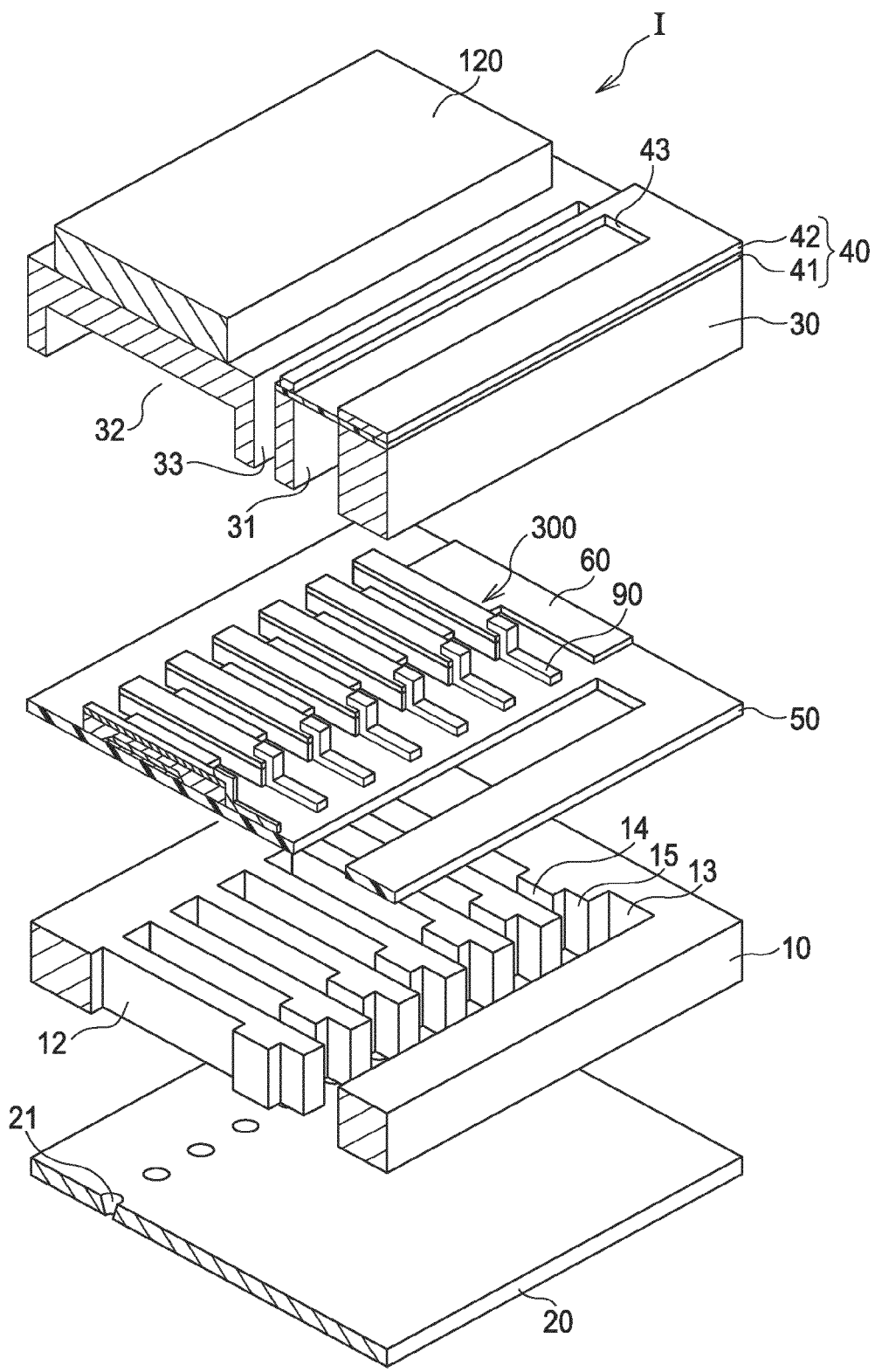
FIG. 1 is an exploded perspective view showing the schematic configuration of the recording head according to the first embodiment.
Figure 2:
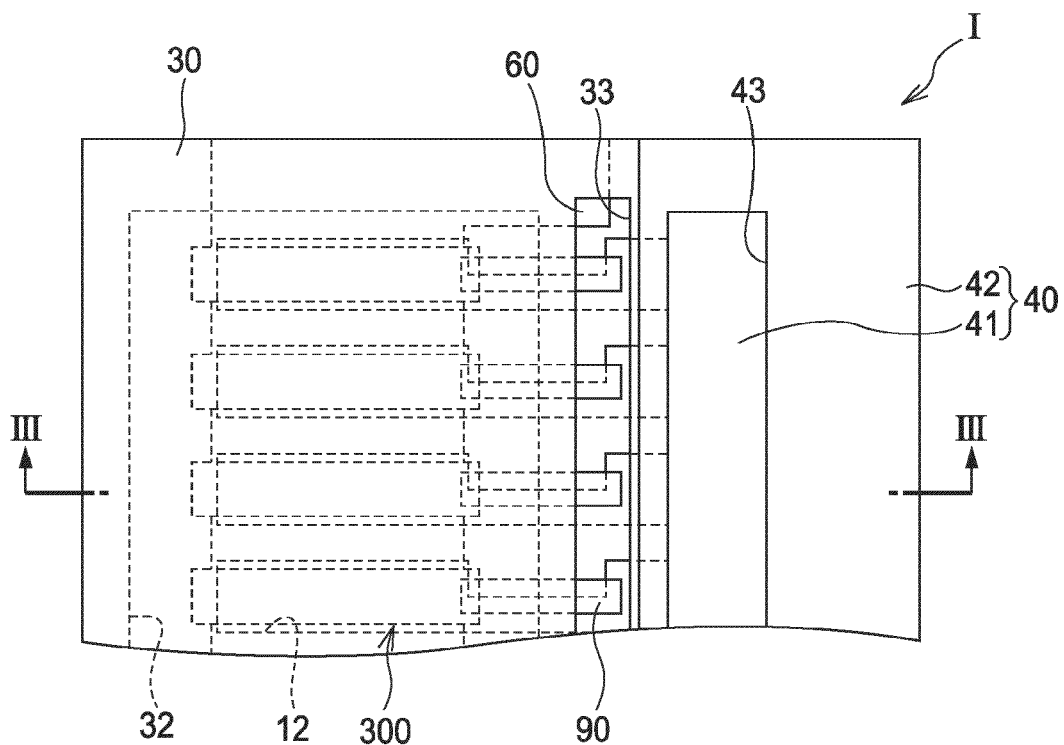
FIG. 2 is a plan view of the recording head according to the first embodiment.
Figure 3:
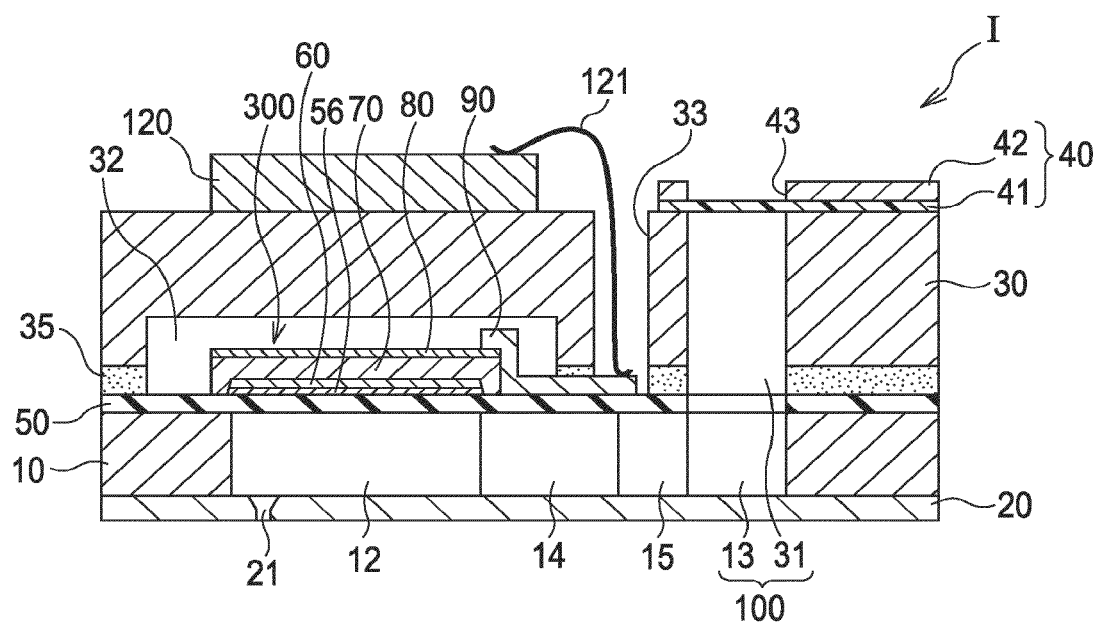
FIG. 3 is a cross-sectional view of the recording head according to the first embodiment.

FIG. 1 is an exploded perspective view showing the schematic configuration of an ink jet-type recording head which is an example of the liquid ejecting head according to the first embodiment of the invention, FIG. 2 is a plan view of FIG. 1, and FIG. 3 is a cross-sectional view taken along the III-III in FIG. 2. As shown in FIGS. 1 to 3, a flow channel-forming substrate 10 of the present embodiment is made of a silicon single crystal substrate and has an elastic film 50 made of silicon dioxide formed on one surface.

A plurality of pressure-generating chambers 12 are provided in parallel in the width direction in the flow channel-forming substrate 10. In addition, a communicating portion 13 is formed in an area outside the longitudinal direction of the pressure-generating chambers 12 in the flow channel-forming substrate 10, and the communicating portion 13 and each of the pressure-generating chambers 12 are communicated with each other via an ink supply channel 14 and a communicating channel 15 provided at each of the pressure-generating chambers 12. The communicating portion 13 is communicated with a reverser portion 31 of a protective substrate as described below so as to compose a part of a reverser that acts as a common ink chamber to the pressure-generating chambers 12. The ink supply channel 14 is formed to be narrower in width than the pressure-generating chamber 12, and maintains a constant resistance at the flow channel to ink flowing into the pressure-generating chamber 12 from the communicating portion 13. Meanwhile, the ink supply channel 14 is formed by narrowing the width of the flow channel from one side in the embodiment, but the ink supply channel may also be formed by narrowing the width of the flow channel from both sides. In addition, the ink supply channel may also be formed by narrowing the flow channel in the thickness direction instead of narrowing the width of the flow channel from both sides. In the embodiment, the flow channel-forming substrate 10 is provided with a liquid flow channel composed of the pressure-generating chambers 12, the communicating portion 13, the ink supply channels 14, and the communicating channels 15.

In addition, a nozzle plate 20 provided with punctured nozzle openings 21 that are communicated to the vicinities of the end portions on the opposite side to the ink supply channel 14 in the pressure-generating chambers 12 is fixed to the opening surface side of the flow channel-forming substrate 10 using an adhesive, a thermally weldable film, or the like. Meanwhile, the nozzle plate 20 is made of, for example, a glass ceramic, a silicon single crystal substrate, stainless steel, or the like.

On the other hand, an elastic film 50 is formed on the opposite side to the opening surface of the flow channel-forming substrate 10, and an adhering layer 56 made of, for example, an about 30 nm to 50 nm-thick titanium oxide film or the like is provided on the elastic film 50 in order to improve the adhesiveness of the elastic film 50 and the like with the foundation of a first electrode 60. Meanwhile, an insulating film made of zirconium oxide or the like may also be provided on the elastic film 50 according to necessity.

Furthermore, the first electrode 60, a piezoelectric layer 70, which is a thin film having a thickness of 2 μm or less, and preferably 0.3 μm to 1.5 μm, a second electrode 80 are laminated on the adhering layer 56, thereby configuring a piezoelectric element 300. Here, the piezoelectric element 300 refers to a portion including the first electrode 60, the piezoelectric layer 70, and the second electrode 80. Generally, any one of the electrodes in the piezoelectric element 300 forms a common electrode, and the other electrode and the piezoelectric layer 70 are patterned for each of the pressure-generating chambers 12. While the first electrode 60 is used as the common electrode of the piezoelectric element 300, and the second electrode 80 is used as the individual electrode of the piezoelectric element 300 in the embodiment, the pair may be switched according to the circumstances of a driving circuit or wiring. In addition, herein, the piezoelectric element 300 and a vibrating plate which is displaced by the driving of the piezoelectric element 300 will be referred to collectively as an actuator apparatus. Meanwhile, while the elastic film 50, the adhering layer 56, the first electrode 60, and the insulating film as provided according to necessity act as the vibrating plate in the above example, the embodiment is naturally not limited thereto, and, for example, the elastic film 50 or the adhering layer 56 may not be provided. In addition, the piezoelectric element 300 itself may substantially act as the vibrating plate.

In addition, in the invention, the piezoelectric material composing the piezoelectric layer 70 is a complex oxide having a perovskite structure that includes Bi, Fe, Ba, Ti, and Co. Meanwhile, as the perovskite structure, the A site is coordinated with 12 oxygen atoms, and the B site is coordinated with 6 oxygen atoms, thereby forming an octahedron in an $ABO_3$ structure. Bi and Ba are located in the A site, and Fe, Co, and Ti are located in the B site. That is, the complex oxide having the perovskite structure that includes Bi, Fe, Ba, Ti, and Co is presumed to be a structure in which some Fe in the solid solutions that are evenly formed of bismuth ferrite and barium titanate is substituted with Co.

Furthermore, in the invention, the complex oxide having the perovskite structure that includes Bi, Fe, Ba, Ti, and Co has a Co/(Co+Fe) ratio, which is the mole ratio of Co to the total amount of Co and Fe, of 0.02 to 0.07.

The complex oxide having the perovskite structure that includes Bi, Fe, Ba, Ti, and Co preferably has a compositional ratio represented by, for example, the following general formula (1). However, the general formula (1) is a composition expression based on stoichiometry, and inevitable composition deviation due to lattice mismatch, oxygen loss, and the like is allowed.

$$[a\{Bi(Fe_{1-b},Co_b)O_3\}-(1-a)\{BaTiO_3\}] \quad (1)$$

$$(0.6 \leq a \leq 0.9, 0.02 \leq b \leq 0.07)$$

As such, when the piezoelectric material composing the piezoelectric layer 70 is a complex oxide having the perovskite structure that includes Bi, Fe, Ba, Ti, and Co, and a Co/(Co+Fe) ratio, which is the mole ratio of Co to the total amount of Co and Fe, of 0.02 to 0.07, the occurrence or growth of cracks can be suppressed in the piezoelectric layer 70 in comparison to systems containing no Co, that is, piezoelectric materials containing Bi, Fe, Ba, and Ti. Therefore, the ink jet-type recording head becomes excellent in terms of reliability. In addition, the hysteresis of the piezoelectric layer 70 also becomes favorable.

Furthermore, when the Co/(Co+Fe) ratio, which is the mole ratio of Co to the total amount of Co and Fe, is 0.02 to 0.05, the insulating properties of the piezoelectric layer 70 become high, and occurrence of leak current can be suppressed. Therefore, insulation breakdown is prevented, and the ink jet-type recording head becomes excellent in terms of reliability.

In addition, when the Co/(Co+Fe) ratio, which is the mole ratio of Co to the total amount of Co and Fe, is 0.05 to 0.07, the strain tolerance amount can be increased.

The piezoelectric layer 70 composed of a complex oxide having the perovskite structure that includes Co in addition to Bi, Fe, Ba, and Ti may further include Mn. While it is known that the leak characteristics are improved when Mn is contained, the detail is known that, when the content of Mn is increased, the crystal grain diameter tends to become finer as described below. When the content of Mn is 2 mol % with respect to Fe, the effect is exhibited. The content of Mn is preferably 10 mol % or less, but when the content of Mn is 10 mol %, cracking tends to become liable to occur after variation over time due to the excessively fine crystal grains, and therefore the content of Mn is preferably 2 mol % to 7 mol % with respect to Fe.

A lead electrode 90 made of, for example, gold (Au) or the like, which is drawn from the vicinity of the end portion on the ink supply channel 14 side and is extended up to on the elastic film 50 or on the insulating film that is provided according to necessity, is connected to the second electrode 80 which is an individual electrode of the piezoelectric element 300.

The protective substrate 30 having the reverser portion 31 that composes at least a part of a reverser 100 is bonded on the flow channel-forming substrate 10 on which the piezoelectric element 300 is formed, that is, on the first electrode 60, the elastic film 50 or the insulating film provided according to necessity, and the lead electrode 90 using an adhesive 35. In the embodiment, the reverser portion 31 penetrates the protective substrate 30 in the thickness direction, is formed along the width direction of the pressure-generating chambers 12, and is communicated with the communicating portion 13 in the flow channel-forming substrate 10 as described above, thereby forming the reverser 100 that acts as the common ink chamber of the pressure-generating chambers 12. In addition, only the reverser portion 31 may be used as the reverser by dividing the communicating portion 13 in the flow channel-forming substrate 10 into plural sections for each of the pressure-generating chambers 12. Furthermore, for example, the ink supply channel 14 communicating the reverser 100 and each of the pressure-generating chambers 12 to members interposed between the flow channel-forming substrate 10 and the protective substrate 30 (for example, the elastic film 50, the insulating film provided according to necessity, and the like) may be provided by providing only the pressure-generating chambers 12 in the flow channel-forming substrate 10.

In addition, a piezoelectric element supporting portion 32 having a space that does not hinder the movement of the piezoelectric element 300 is provided in an area in the protective substrate 30 which faces the piezoelectric element 300. The piezoelectric supporting portion 32 is simply required to have a space that does not hinder the movement of the piezoelectric element 300, and the space may or may not be sealed.

It is preferable to use materials having substantially the same coefficient of thermal expansion as the flow channel-forming substrate 10, for example, glass, ceramics, and other materials, for the protective substrate 30, and the protective substrate was formed using a silicon single crystal substrate made of the same material as the flow channel-forming substrate 10 in the embodiment.

In addition, a penetrating hole 33 that penetrates the protective substrate 30 in the thickness direction is provided in the protective substrate 30. In addition, the penetrating hole is provided so that the vicinity of the end portion of the lead electrode 90 drawn from each of the piezoelectric elements 300 is exposed in the penetrating hole 33.

In addition, a driving circuit 120 is fixed to the protective substrate 30 in order to drive the piezoelectric elements 300 provided in parallel. It is possible to use, for example, a circuit substrate, a semiconductor integrated circuit (IC), and the like as the driving circuit 120. In addition, the driving circuit 120 and the lead electrode 90 are electrically connected via a connecting wire 121 composed of a conductive wire, such as a bonding wire.

A compliance substrate 40 composed of a sealing film 41 and a fixing plate 42 is bonded on the protective substrate 30. Here, the sealing film 41 is made of a material having low stiffness and flexibility, and one surface of the reverser portion 31 is sealed by the sealing film 41. In addition, the fixing plate 42 is formed of a relatively hard material. Since the area of the fixing plate 42 facing the reverser 100 forms an opening portion 43 that is fully removed in the thickness direction, the one surface of the reverser 100 is sealed only by the sealing film 41.

In the ink jet-type recording head I of the embodiment, an ink is imported from an ink introducing opening connected with an external ink supplying section, not shown, the inside from the reverser 100 to the nozzle openings 21 is filled with the ink, a voltage is applied between each pair of the first electrode 60 and the second electrode 80 which corresponds to the pressure-generating chamber 12 according to recording signals from the driving circuit 120, and the elastic film 50, the adhering layer 56, the first electrode 60, and the piezoelectric layer 70 are bent, thereby increasing the pressure in each of the pressure-generating chambers 12 and discharging ink droplets from the nozzle openings 21.

Next, an example of the method of manufacturing the ink jet-type recording head of the embodiment will be described with reference to FIGS. 4 to 8. Meanwhile, FIGS. 4 to 8 are cross-sectional views of the pressure-generating chamber in the longitudinal direction.

Figure 4A:
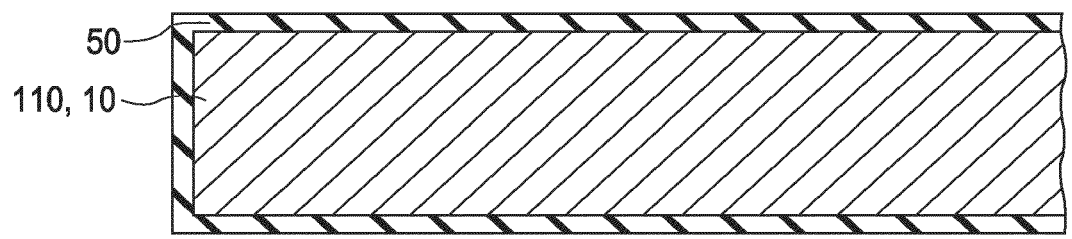
FIGS. 4A and 4B are cross-sectional views showing a process of manufacturing the recording head according to the first embodiment.
Figure 4B:
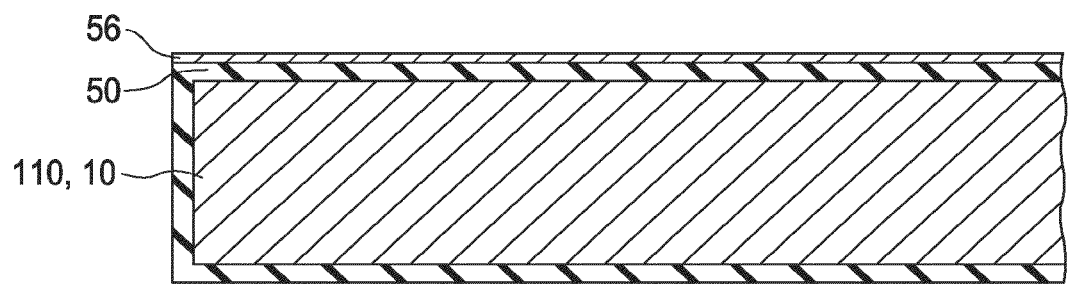

Firstly, as shown in FIG. 4A, a silicon dioxide film made of silicon dioxide ($SiO_2$) or the like composing the elastic film 50 is formed on the surface of a flow channel-forming substrate wafer 110, which is a silicon wafer, by thermal oxidation or the like. Next, as shown in FIG. 4B, the adhering layer 56 made of a titanium oxide film or the like is formed on the elastic film 50 (silicon dioxide film) by the sputtering method, thermal oxidation, or the like.

Figure 5A:
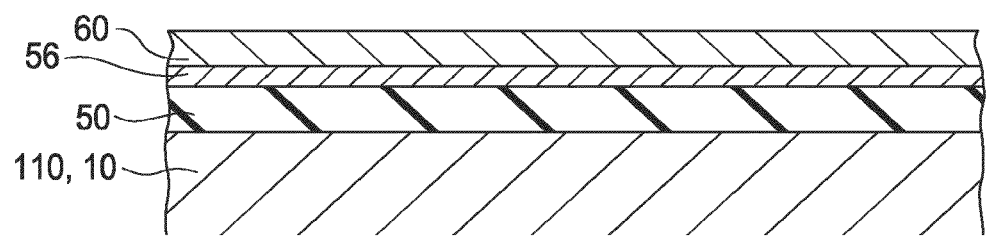
FIGS. 5A to 5C are cross-sectional views showing the process of manufacturing the recording head according to the first embodiment.

Next, as shown in FIG. 5A, the first electrode 60 made of platinum, iridium, iridium oxide, or laminate structures thereof is formed throughout the entire surface of the adhering layer 56 by the sputtering method or the like.

Next, the piezoelectric layer 70 is laminated on the first electrode 60. The method of manufacturing the piezoelectric layer 70 is not particularly limited, and the piezoelectric layer 70 can be formed using, for example, chemical solution methods, such as the metal-organic decomposition (MOD) method, the sol-gel method, or the like, in which a solution having an organic metallic compound dissolved and dispersed in a solvent is coated, dried, and, furthermore, fired at a high temperature, thereby obtaining the piezoelectric layer 70 composed of a metallic compound. In addition, liquid-phase methods, such as the laser ablation method, the sputtering method, the pulse laser deposition method (PLD method), the CVD method, and the aerosol deposition method, or solid-phase methods may be used.

Figure 5B:
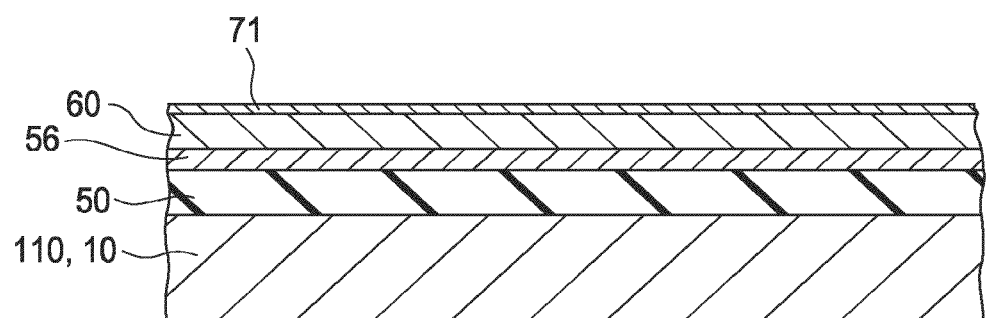

As a specific example of the procedure of forming the piezoelectric layer 70, firstly, a piezoelectric precursor film 71 is formed on the first electrode 60 by coating a sol or an MOD solution (precursor solution) including an organic metallic compound, specifically, an organic metallic compound containing Bi, Fe, Ba, Ti, Co, and the like in a ratio that becomes the target compositional ratio by the sputtering method, and the like as shown in FIG. 5B (coating process).

The precursor solution to be coated is obtained by mixing the organic metallic compound including Bi, Fe, Ba, Ti, and Co respectively so that each metal becomes a desired mole ratio, and dissolving or dispersing the mixture using an organic solvent, such as alcohol. Examples of the organic metallic compounds including Bi, Fe, Ba, Ti, and Co respectively that can be used include metal alkoxides, organic acid salts, β diketone complex, and the like. Examples of the organic metallic compound including Bi include bismuth 2-ethylhexanoate, and the like. Examples of the organic metallic compound including Fe include iron 2-ethylhexanoate, and the like. Examples of the organic metallic compound including Ba include barium isopropoxide, barium 2-ethylhexanoate, barium acetylacetonate, and the like. Examples of the organic metallic compound containing Ti include titanium isopropoxide, titanium 2-ethylhexanoate, titanium(di-i-propoxide)bis(acetylacetonate), and the like. Examples of the organic metallic compound including Co include cobalt (III) acetylacetonate, and the like. Naturally, organic metallic compounds including two or more of Bi, Fe, Ba, Ti, and Co may be used.

Figure 5C:
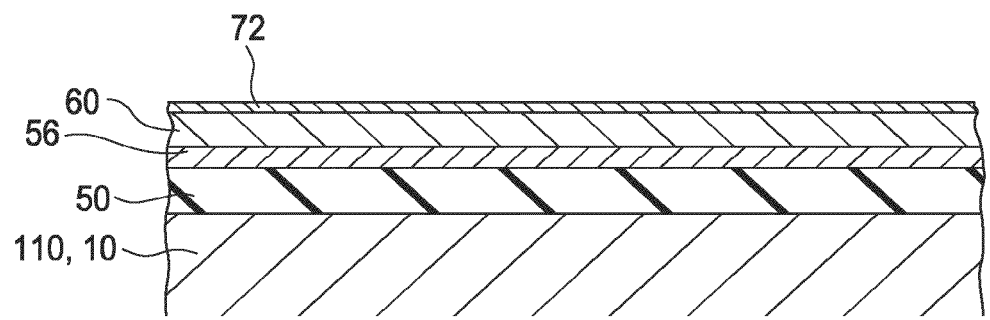

Next, the piezoelectric precursor film 71 is heated to a predetermined temperature (for example, 150° C. to 200° C.) and dried for a certain amount of time (drying process). Next, the dried piezoelectric precursor film 71 is heated to a predetermined temperature (for example, 350° C. to 450° C.) and retained for a certain amount of time, thereby carrying out delipidation (delipidating process). The delipidation as mentioned herein refers to separating the organic components included in the piezoelectric precursor film 71 in the form of, for example, $NO_2$, $CO_2$, $H_2O$, and the like. The atmosphere in the drying process or the delipidating process is not limited, and the atmosphere, an oxygen atmosphere, or an inert gas may also be used. Meanwhile, the coating process, the drying process, and the delipidation process may be carried out plural times. Next, as shown in FIG. 5C, the piezoelectric precursor film 71 is heated to a predetermined temperature, for example, about 650° C. to 780° C. and retained for a certain amount of time, thereby crystallizing the piezoelectric precursor film and forming a piezoelectric film 72 (firing process). Even in the firing process, the atmosphere is not limited, and the atmosphere, an oxygen atmosphere, or an inert gas may also be used. Meanwhile, it is known that the firing temperature is particularly preferably 650° C. to 750° C. while the detail will be described below.

While cracks become liable to occur in a piezoelectric layer made of a piezoelectric material in the related art during the firing process, in the invention, the piezoelectric layer 70 is a complex oxide having the perovskite structure that includes Bi, Fe, Ba, Ti, and Co, and a Co/(Co+Fe) ratio, which is the mole ratio of Co to the total amount of Co and Fe, of 0.02 to 0.07, and therefore occurrence of cracks in the piezoelectric layer 70 is suppressed as shown in examples as described below. In addition, when the piezoelectric layer 70 is left to stand for a long time, for example, 4 days or longer at room temperature (for example, about 23° C. to 26° C.), cracks particularly become liable to occur in the piezoelectric layer 70, or cracks grow; however, in the invention, even when the piezoelectric layer is left to stand for a long time at room temperature, it is possible to suppress the occurrence of cracks.

Meanwhile, examples of a heating apparatus that is used in the drying process, the delipidation process, and the firing process include a rapid thermal annealing (RTA) apparatus that carries out heating by irradiation of an infrared lamp, a hot plate, and the like.

Figure 6A:
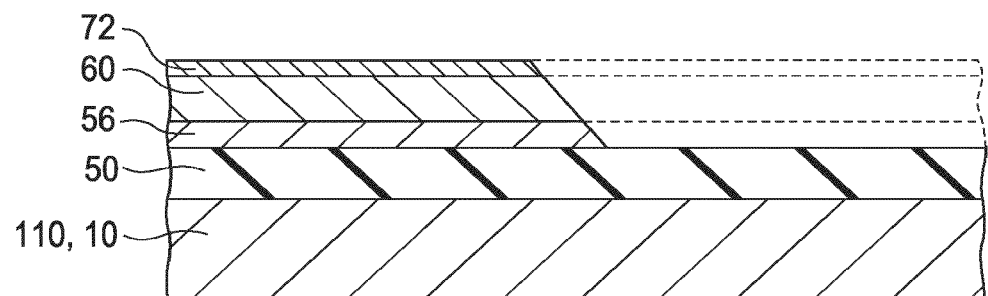
FIGS. 6A and 6B are cross-sectional views showing the process of manufacturing the recording head according to the first embodiment.

Next, as shown in FIG. 6A, the first electrode 60 and the first layer of the piezoelectric film 72 are patterned at the same time on the piezoelectric film 72 using a predetermined-shaped register (not shown) as a mask so that the side surfaces thereof become slanted.

Figure 6B:
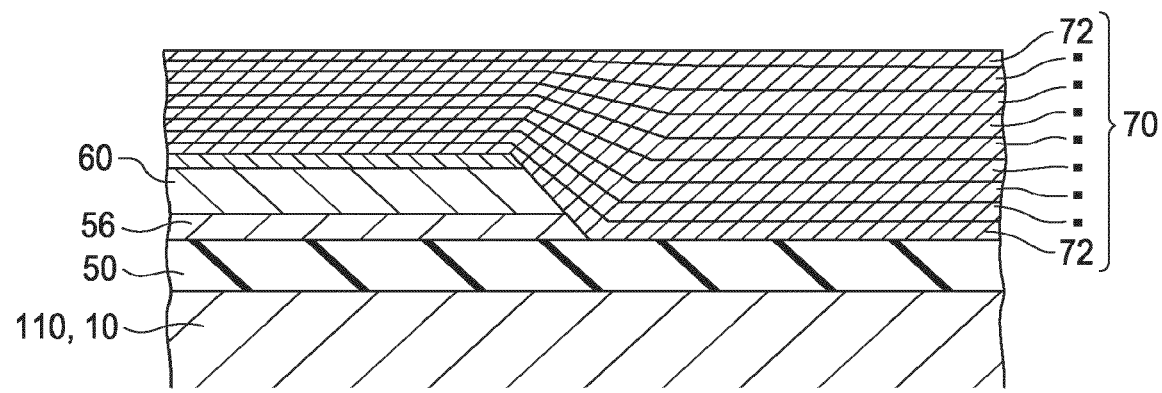

Next, after the register is separated, the coating process, the drying process, and the delipidation process, or the coating process, the drying process, the delipidation process, and the firing process are repeated plural times depending on a desired film thickness and the like so as to form the piezoelectric layer 70 composed of a plurality of the piezoelectric films 72, thereby forming a predetermined-thick piezoelectric layer 70 composed of plural layers of the piezoelectric films 72 as shown in FIG. 6B. For example, when the film thickness is about 0.1 μm for one cycle of a coating solution, the entire film thickness of the piezoelectric layer 70 composed of 10 layers of the piezoelectric films 72 becomes, for example, about 1.1 μm. Meanwhile, the piezoelectric layer is provided by laminating the piezoelectric films 72 in the embodiment, but the piezoelectric layer may be one layer.

Figure 7A:
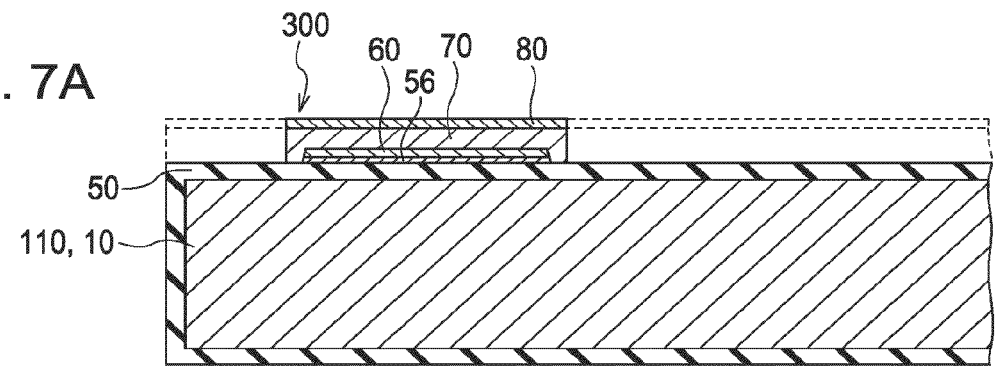
FIGS. 7A to 7C are cross-sectional views showing the process of manufacturing the recording head according to the first embodiment.

After the piezoelectric layer 70 is formed, the second electrode 80 made of platinum or the like is formed on the piezoelectric layer 70 by the sputtering method or the like as shown in FIG. 7A, and the piezoelectric layer 70 and the second electrode 80 are patterned at the same time in the area facing each of the pressure-generating chambers 12, thereby forming the piezoelectric element 300 composed of the first electrode 60, the piezoelectric layer 70, and the second electrode 80. Meanwhile, the patterning of the piezoelectric layer 70 and the second electrode 80 can be carried out in a batch by dry etching via a register formed into a predetermined shape (not shown). After that, post annealing may be carried out in a temperature range of, for example, 650° C. to 780° C. according to necessity. Thereby, favorable interfaces between the piezoelectric layer 70, the first electrode 60, and the second electrode 80 can be formed, and the crystallinity of the piezoelectric layer 70 can be improved.

Figure 7B:
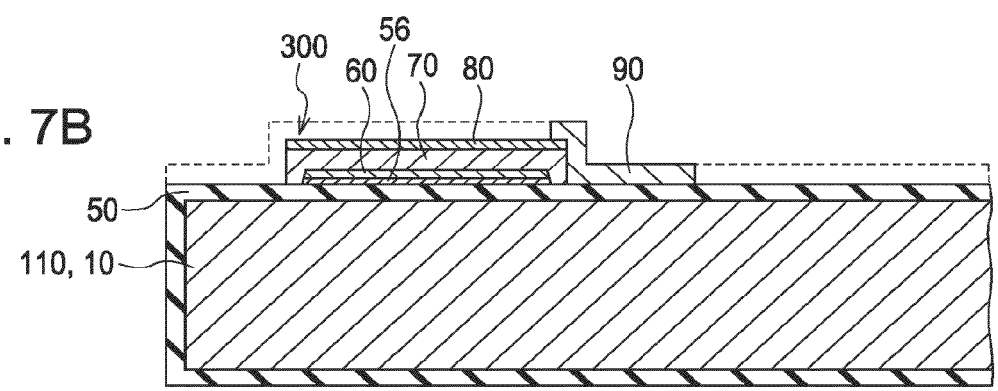

Next, after the lead electrode 90 made of, for example, silver (Au) or the like is formed throughout the entire surface of the flow channel-forming substrate wafer 110 as shown in FIG. 7B, patterning is carried out for each of the piezoelectric elements 300 via, for example, a mask pattern (not shown) composed of a register and the like.

Figure 7C:
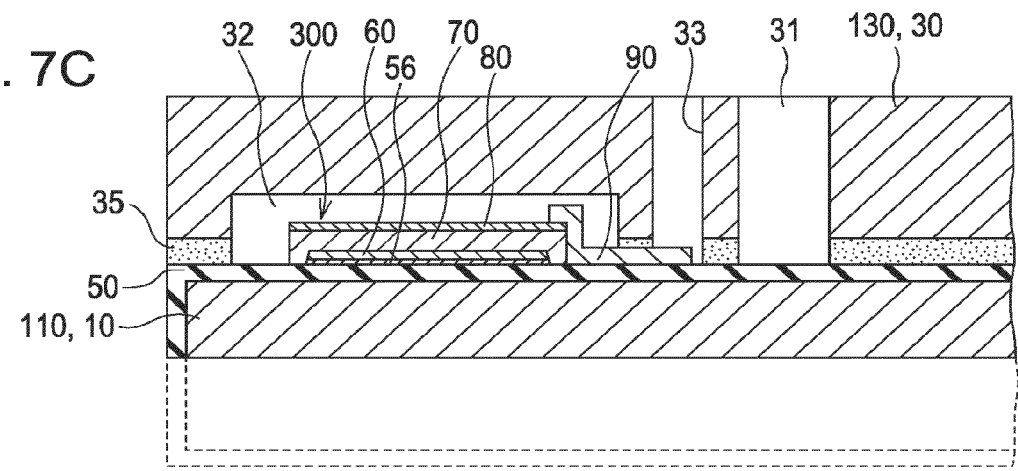

Next, after a protective substrate wafer 130 composed of a plurality of the protective substrates 30, which are silicon wafers, is bonded on the piezoelectric element 300 side of the flow channel-forming substrate wafer 110 via the adhesive 35 as shown in FIG. 7C, the flow channel-forming substrate wafer 110 is made to be thin into a predetermined thickness.

Figure 8A:
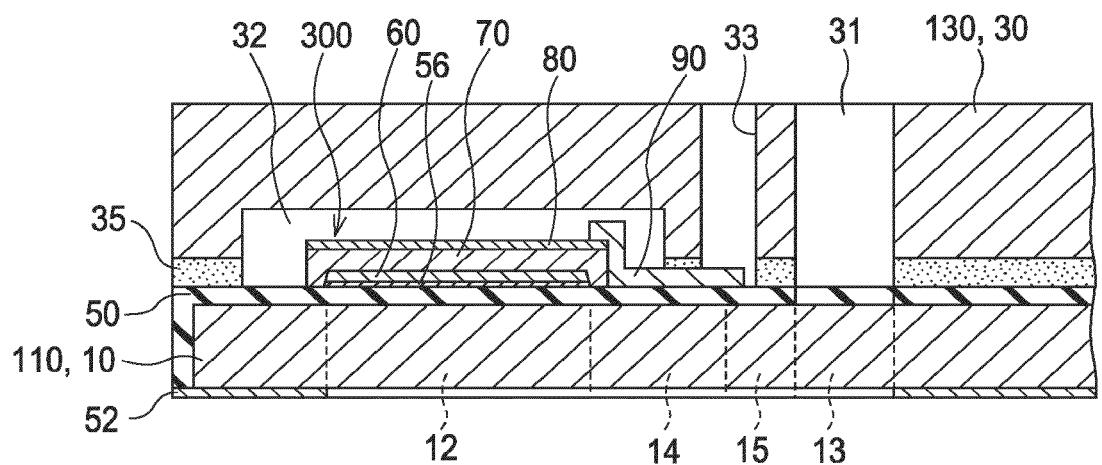
FIGS. 8A and 8B are cross-sectional views showing the process of manufacturing the recording head according to the first embodiment.

Next, a mask film 52 is newly formed on the flow channel-forming substrate wafer 110 as shown in FIG. 8A, and is patterned into a predetermined shape.

Figure 8B:
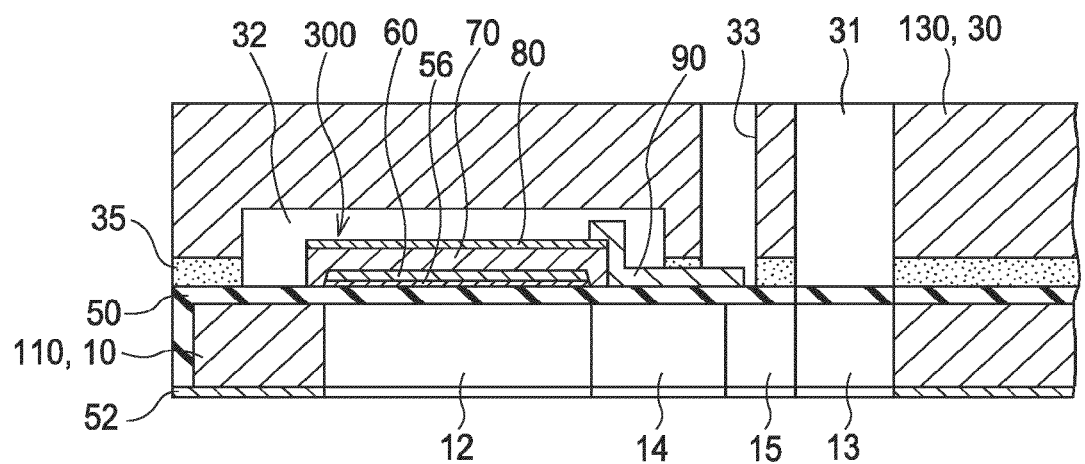

In addition, the pressure-generating chambers 12, the communicating portion 13, the ink supply channel 14, the communicating channel 15, and the like, which correspond to the piezoelectric elements 300, are formed by carrying out anisotropic etching (wet etching) on the flow channel-forming substrate wafer 110 via the mask film 52 using an alkali solution, such as KOH as shown in FIG. 8B.

After that, unnecessary portions in the outer circumferential portions of the flow channel-forming substrate wafer 110 and the protective substrate wafer 130 are removed by carrying out cutting using, for example, dicing or the like. In addition, after the mask film 52 on the surface of the flow channel-forming substrate wafer 110 on the opposite side of the protective substrate wafer 130 is removed, the nozzle plate 20 having the punctured nozzle openings 21 is bonded, and along with this, the compliance substrate 40 is bonded to the protective substrate wafer 130, and the flow channel-forming substrate wafer 110 and the like are divided into the flow channel-forming substrate 10 and the like of one chip size as shown in FIG. 1, thereby manufacturing the ink jet-type recording head I of the embodiment.

EXAMPLES

Hereinafter, examples will be shown, and the invention will be described more specifically. Meanwhile, the invention is not limited to the following examples.

Example 1

Firstly, a 1200 nm-thick silicon dioxide film was formed on the surface of a (110)-oriented single crystal silicon substrate by thermal oxidation. Next, a 40 nm-thick titanium film was formed on the silicon dioxide film by the RF magnetron sputtering method, and thermally oxidized, thereby forming a titanium oxide film. Next, a 130 nm-thick platinum film was formed on the titanium oxide film by the RF magnetron sputtering method, thereby manufacturing a (111)-oriented first electrode 60.

Next, the piezoelectric layer 70 was formed on the first electrode 60 by the spin coating method. The method was as follows. Firstly, an octane solution of bismuth 2-ethylhexanoate, a xylene solution of iron 2-ethylhexanoate, an octane solution of barium 2-ethylhexanoate, an octane solution of titanium 2-ethylhexanoate, and an octane solution of cobalt 2-ethylhexanoate were mixed in a predetermined ratio, thereby preparing a precursor solution. In addition, the precursor solution was dropped on the substrate having the titanium oxide film and the first electrode 60 formed thereon, and the substrate was rotated at 3000 rpm for 20 seconds, thereby forming a piezoelectric precursor film (coating process). Next, the substrate was mounted on a hot plate, and dried at 150° C. for 2 minutes (drying process). Next, the substrate was mounted on the hot plate, and delipidation was carried out at 450° C. for 2 minutes (delipidating process). After the process composed of the coating process, the drying process, and the delipidating process was repeated three times, firing was carried out in an oxygen atmosphere by rapid thermal annealing (RTA) at 780° C. for 5 minutes (firing process). Next, after the process composed of the coating process, the drying process, and the delipidating process was repeated three times, a process in which the firing process for firing in a batch is carried out was repeated three times, and an overall 660 nm-thick piezoelectric layer was formed by coating a total of 9 times.

After that, a 130 nm-thick platinum film was formed on the piezoelectric layer 70 as the second electrode 80 by the DC sputtering method, and then firing was carried out using rapid thermal annealing (RTA) at 780° C. for 5 minutes, thereby forming the piezoelectric element 300 having a complex oxide having the perovskite structure represented by the general formula (1) with a=0.75 and b=0.02 as the piezoelectric layer 70. In addition, the piezoelectric layer 70 was produced by the same operation as the above for Test Example 1 as described below, and was left to stand as it was for 4 days at room temperature (23° C. to 26° C.).

Examples 2 to 4 and Comparative Examples 1 to 2

The piezoelectric element 300 was formed in the same manner as Example 1 except that a precursor solution having a changed mixing ratio of an octane solution of bismuth 2-ethylhexanoate, an octane solution of iron 2-ethylhexanoate, an octane solution of barium 2-ethylhexanoate, an octane solution of titanium 2-ethylhexanoate, and an octane solution of cobalt 2-ethylhexanoate was used, and the complex oxides represented by the general formula (1) with 'a's and 'b's shown in Table 1 were used as the piezoelectric layer 70. Meanwhile, the thicknesses of the piezoelectric layers 70 were 640 nm in Example 2, 651 nm in Example 3, 663 nm in Example 4, 671 nm in Comparative Example 1, and 671 nm in Comparative Example 2.

TABLE 1

|  | a | b | Co/(Co + Fe) ratio (mole ratio) |
| --- | --- | --- | --- |
| Comparative Example 1 | 0.75 | 0 | 0 |
| Comparative Example 2 | 0.75 | 0.01 | 0.01 |
| Example 1 | 0.75 | 0.02 | 0.02 |
| Example 2 | 0.75 | 0.03 | 0.03 |
| Example 3 | 0.75 | 0.05 | 0.05 |
| Example 4 | 0.75 | 0.07 | 0.07 |

Test Example 1

Figure 9C:
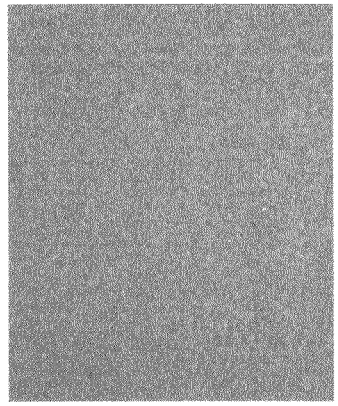
FIGS. 9A to 9F are photographs of the surfaces of the piezoelectric layers observed using a metal microscope immediately after formation.
Figure 9B:
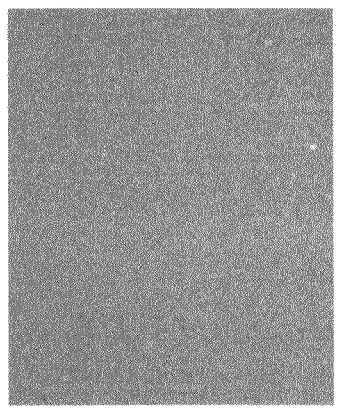
Figure 9A:
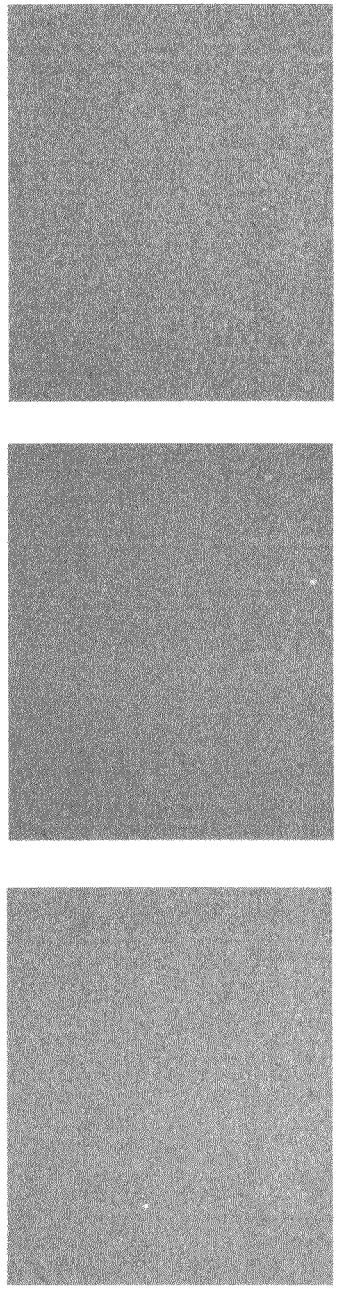
Figure 9F:
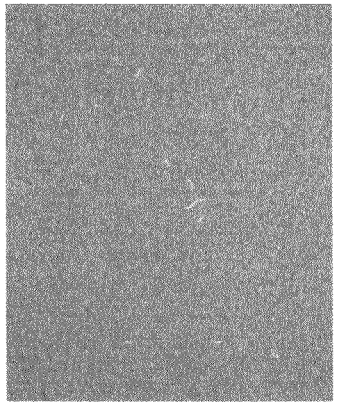
Figure 9E:
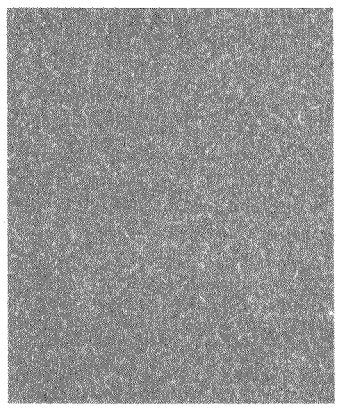
Figure 9D:
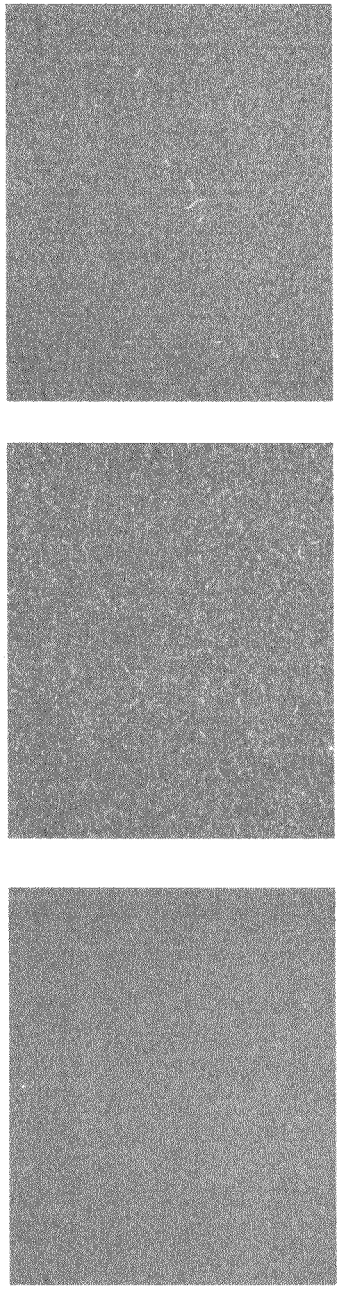
Figure 10C:
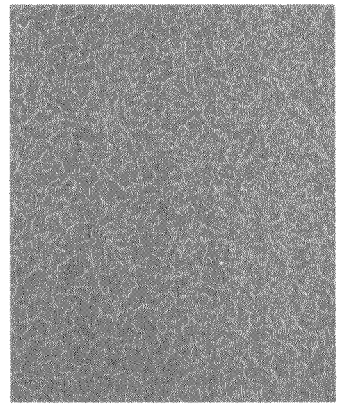
FIGS. 10A to 10F are photographs of the surfaces of the piezoelectric layers observed using a metal microscope after being left to stand for 4 days.
Figure 10B:
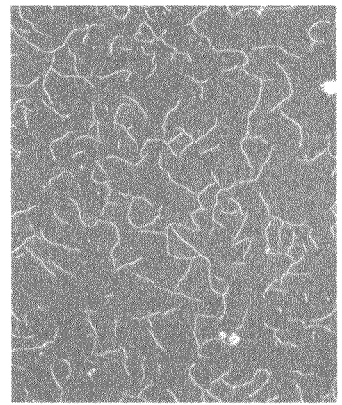
Figure 10A:
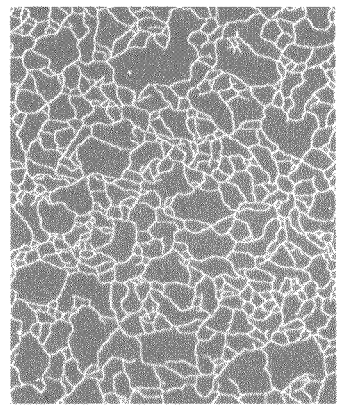
Figure 10F:
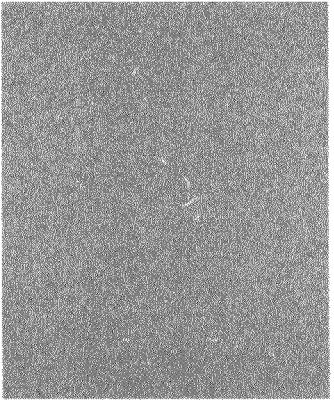
Figure 10E:
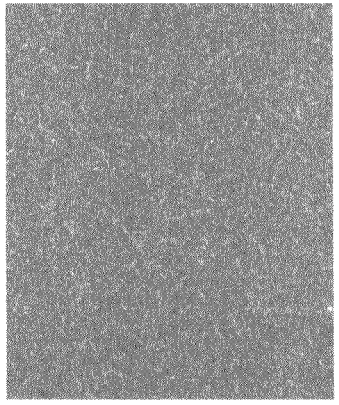
Figure 10D:
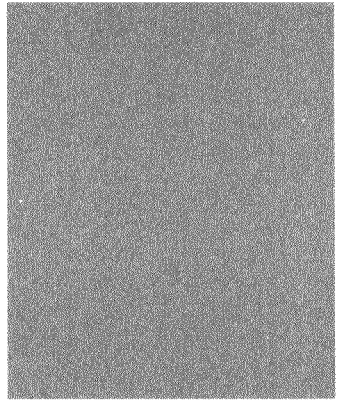

In Examples 1 to 4 and Comparative Examples 1 to 2, the surfaces of the piezoelectric layers 70 in a state in which the second electrode 80 was not formed were observed using a metal microscope with 200× magnification immediately after formation and after being left to stand for 4 days after the formation. With regard to the piezoelectric layers 70 immediately after the formation, the result of Comparative Example 1 is shown in FIG. 9A, the result of Comparative Example 2 is shown in FIG. 9B, the result of Example 1 is shown in FIG. 9C, the result of Example 2 is shown in FIG. 9D, the result of Example 3 is shown in FIG. 9E, and the result of Example 4 is shown in FIG. 9F. In addition, with regard to the piezoelectric layer 70 being left to stand for 4 days after the formation, the result of Comparative Example 1 is shown in FIG. 10A, the result of Comparative Example 2 is shown in FIG. 10B, the result of Example 1 is shown in FIG. 10C, the result of Example 2 is shown in FIG. 10D, the result of Example 3 is shown in FIG. 10E, and the result of Example 4 is shown in FIG. 10F.

As a result, in Examples 1 to 4 in which the Co/(Co+Fe) ratio (mole ratio) is 0.02 to 0.07, cracks were hardly observed immediately after the formation, and the state was almost the same as immediately after the formation even after being left to stand for 4 days after the formation. Particularly, in Examples 1 and 2, no cracks were observed immediately after the formation and after being left to stand for 4 days after the formation. On the other hand, in Comparative Example 1 in which no Co was included or Comparative Example 2 in which the Co/(Co+Fe) ratio (mole ratio) was 0.01, cracks were rarely observed immediately after the formation, but a number of large cracks were observed when the piezoelectric layer was left to stand for 4 days.

Test Example 2

Figure 11F:
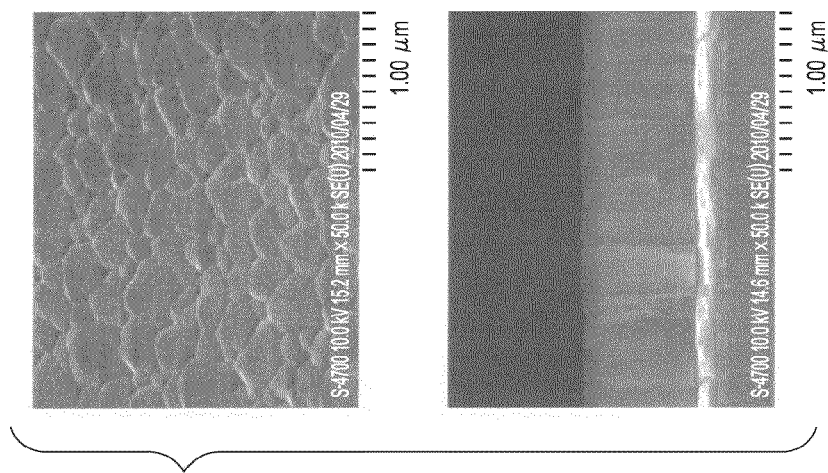
Figure 11E:
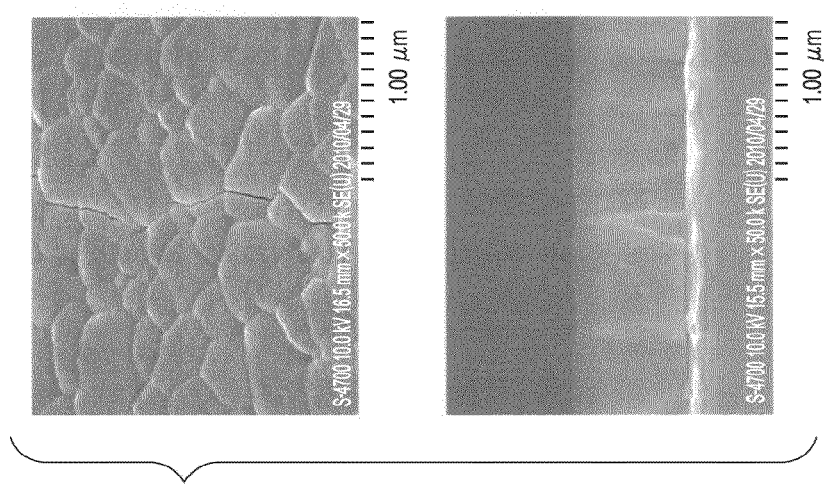
Figure 11D:
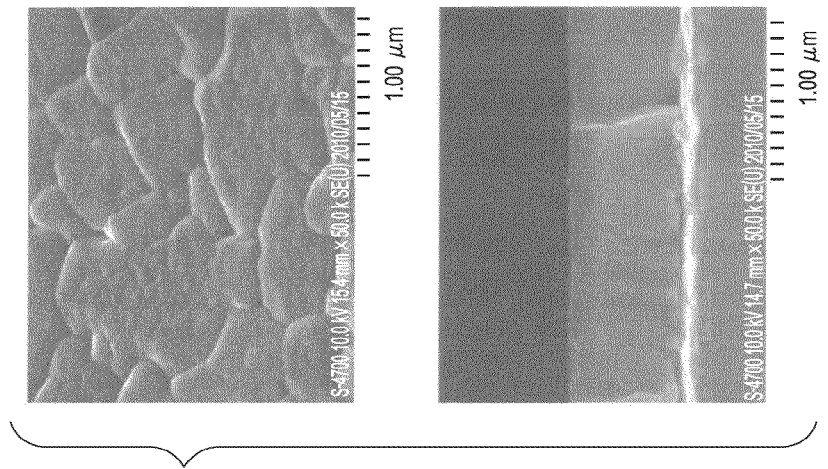

In Examples 1 to 4 and Comparative Examples 1 to 2, the surfaces and cross-sections of the piezoelectric layers 70 in a state in which the second electrode 80 was not formed were observed using a scanning electron microscope (SEM) with 50,000× magnification immediately after the formation. The result of Comparative Example 1 is shown in FIG. 11A, the result of Comparative Example 2 is shown in FIG. 11B, the result of Example 1 is shown in FIG. 11C, the result of Example 2 is shown in FIG. 11D, the result of Example 3 is shown in FIG. 11E, and the result of Example 4 is shown in FIG. 11F. Meanwhile, in each of the drawings, the upper part is the observation result of the surface, and the bottom part is the observation result of the cross-section.

As a result, both in Examples 1 to 4 and Comparative Examples 1 to 2, the morphology was favorable, and dense films were formed. In addition, as the content of Co increased, the crystal grains became large, becoming largest in Example 2. Furthermore, when Co was added, the crystal grains became small.

Test Example 3

Figure 12:
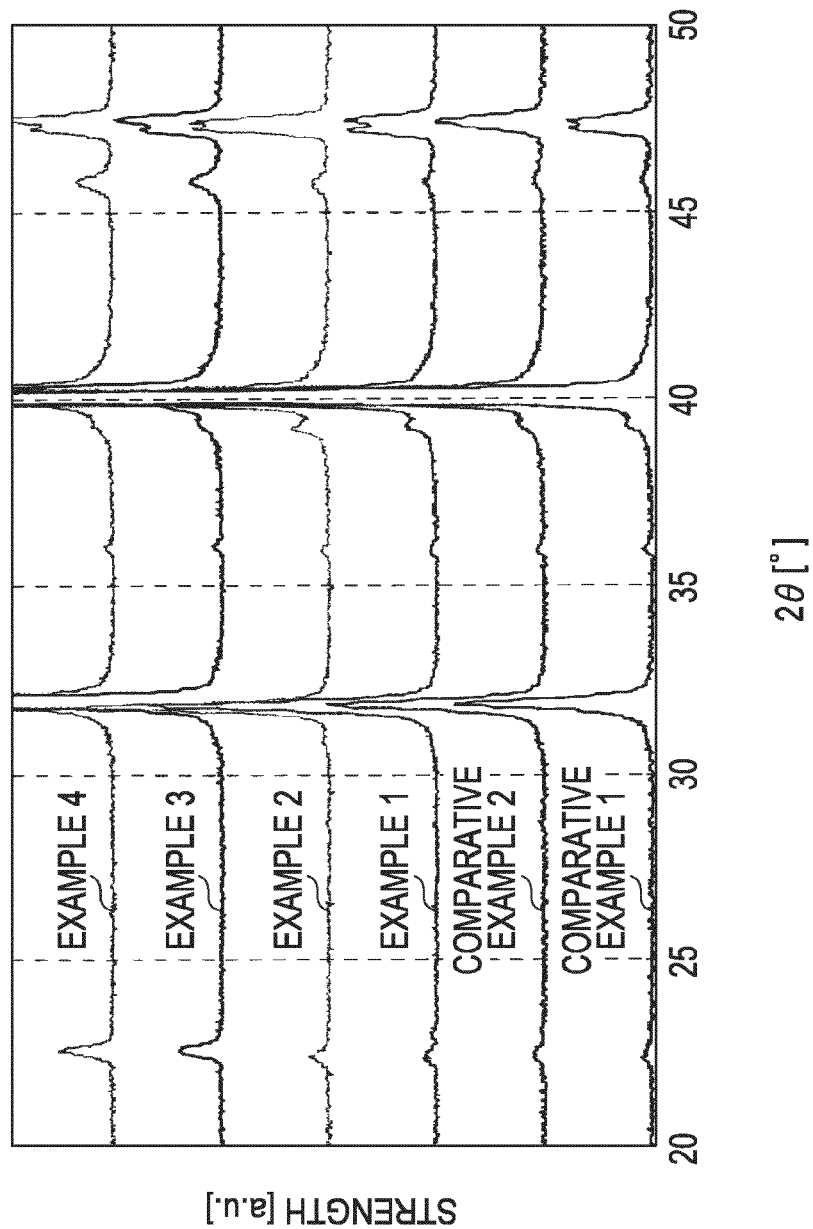
FIG. 12 is a view showing X-ray diffraction patterns.

With regard to Examples 1 to 4 and Comparative Examples 1 to 2, the powder X-ray diffraction patterns of the piezoelectric layers 70 were obtained at room temperature using a "D8 Discover," manufactured by Bruker AXS and CuKα radiation as the X-ray source. The X-ray diffraction patterns, which are views showing the relative relationships between the obtained diffraction intensities and the diffraction angles 2θ, are shown in FIG. 12. As a result, peaks induced by the perovskite structure were observed in all of Examples 1 to 4 and Comparative Examples 1 to 2 as shown in FIG. 12.

Test Example 4

With regard to the piezoelectric element of each of Examples 1 to 4 and Comparative Examples 1 to 2, the relationship between P (polarization amount) and V (voltage) was obtained by applying a triangle wave with a frequency of 1 Hz at room temperature using an electrode pattern having ϕ=400 μm with a "FCE-1A," manufactured by Toyo Corporation. The result of Comparative Example 1 is shown in FIG. 13A, the result of Comparative Example 2 is shown in FIG. 13B, the result of Example 1 is shown in FIG. 13C, the result of Example 2 is shown in FIG. 13D, the result of Example 3 is shown in FIG. 13E, and the result of Example 4 is shown in FIG. 13F.

As a result, the hysteresis curves were favorable in Examples 1 to 4. On the other hand, the hysteresis curve was in a swollen shape and was not favorable in Comparative Example 2, and no hysteresis was exhibited due to leak current in Comparative Example 1.

Test Example 5

Figure 14:
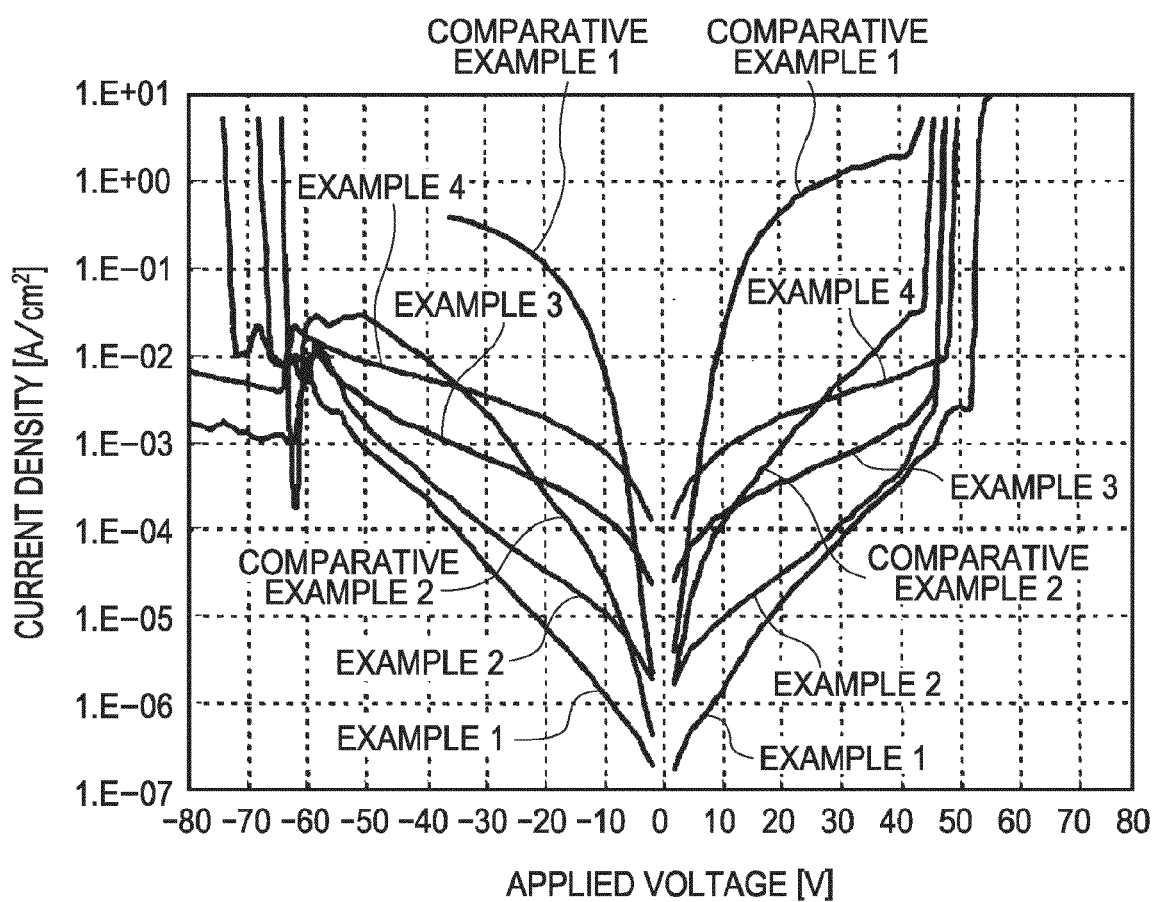
FIG. 14 is a view showing I-V curves.

With regard to the piezoelectric element of each of Examples 1 to 4 and Comparative Examples 1 to 2, the relationship between the current density and the voltage (I-V curve) was obtained by applying a voltage of ±80 V. The results are shown in FIG. 14. As a result, it was found that the leak current values were low, and the Co/(Co+Fe) ratios (mole ratios) were 0.02 to 0.05, whereby the insulating properties were improved, and pressure resistances were also improved in Examples 1 to 3. Meanwhile, the negative side of Comparative Example 1 shows shifting in FIG. 14.

Test Example 6

Figure 15:
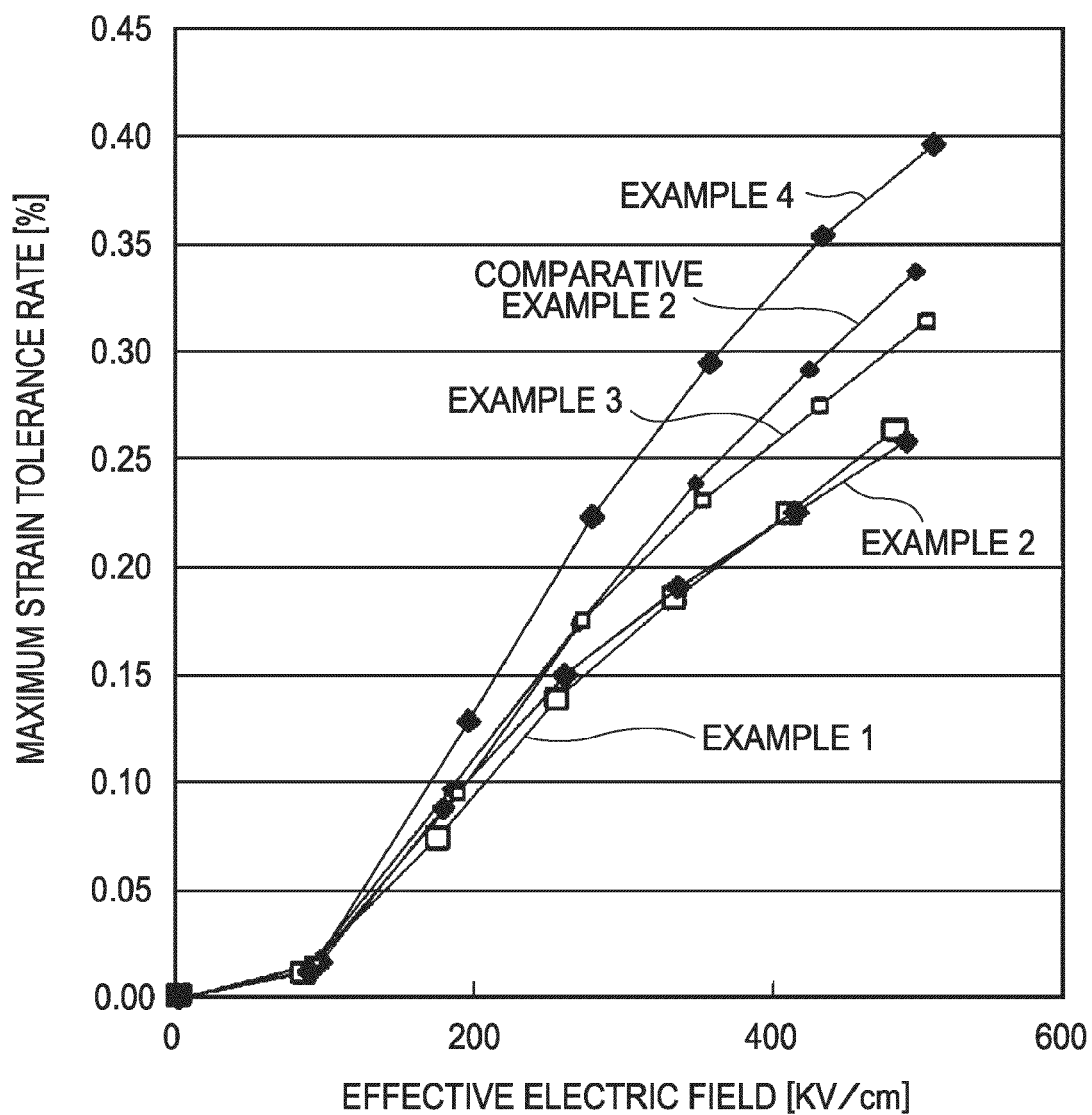
FIG. 15 is a view showing the relationships between the maximum strain rate and the electric field.

With regard to the piezoelectric element of each of Examples 1 to 4 and Comparative Examples 1 to 2, the relationship between the maximum strain rate and the effective electric field was obtained by applying a voltage with a frequency of 1 kHz at room temperature using a double beam laser interferometer (DBLI) manufactured by aixACCT Systems Inc. and an electrode pattern of ϕ=500 μm. Meanwhile, the maximum strain rate refers to the strain rate at the most strained place in the piezoelectric layer 70, and the effective electric field refers to the electric field at the most strained place in the piezoelectric layer 70. The results are shown in FIG. 15. As shown in FIG. 15, it is found that the strain rate was large, and was about 0.31% to 0.4% at an effective electric field of 500 KV/cm, and the strain tolerance amount can be increased by adjusting the Co/(Co+Fe) ratio (mole ratio) to be 0.05 to 0.07 in Examples 3 and 4.

Sample 11

Similarly to Example 1, after a 1200 nm-thick silicon dioxide film, a titanium oxide film, and the 100 nm-thick and (111)-oriented first electrode 60 were formed on the surface of a (110) single crystal silicon substrate, the piezoelectric layer 70 was formed on the first electrode 60 by spin coating method. The method was as follows. Firstly, an octane solution of bismuth 2-ethylhexanoate, a xylene solution of iron 2-ethylhexanoate, an octane solution of barium 2-ethylhexanoate, an octane solution of titanium 2-ethylhexanoate, and an octane solution of cobalt 2-ethylhexanoate were mixed so that "a" and "b" become 0.75 and 0.02 respectively in the above formula (1), thereby preparing a precursor solution. In addition, the precursor solution was dropped on the substrate having the titanium oxide film and the first electrode 60 formed thereon, and the substrate was rotated at 3000 rpm for 20 seconds, thereby forming a piezoelectric precursor film (coating process). Next, the substrate was mounted on a hot plate, and dried at 150° C. for 2 minutes (drying process). Next, the substrate was mounted on the hot plate, and delipidation was carried out at 450° C. for 2 minutes (delipidating process). After the process composed of the coating process, the drying process, and the delipidating process was repeated three times, firing was carried out in an oxygen atmosphere by rapid thermal annealing (RTA) at 500° C. for 5 minutes (firing process). Next, after the process composed of the coating process, the drying process, and the delipidating process was repeated three times, a process in which the firing process for firing in a batch is carried out was repeated three times, and an overall 660 nm-thick piezoelectric layer was formed by coating a total of 9 times.

After that, a 130 nm-thick platinum film was formed on the piezoelectric layer 70 as the second electrode 80 by the DC sputtering method, and then firing was carried out using rapid thermal annealing (RTA) at 500° C. for 5 minutes, thereby forming the piezoelectric element 300 having a complex oxide having the perovskite structure represented by the general formula (1) with a=0.75 and b=0.02 as the piezoelectric layer 70. In addition, the piezoelectric layer 70 was produced by the same operation as the above for Test Example 1 as described below, and was left to stand as it was for 4 days at room temperature (23° C. to 26° C.).

Samples 12 to 17

Samples 12 to 17 were produced in the same manner as in Sample 11 except that the firing temperature of the firing process and firing using RTA after the second electrode 80 was provided were set to 600° C. (Sample 12), 680° C. (Sample 13), 700° C. (Sample 14), 750° C. (Sample 15), 780° C. (Sample 16), and 830° C. (Sample 17).

Standard Sample

The standard sample was produced in the same manner as in Sample 11 except that the composition was set to have a=0.75 and b=0 in the general formula (1), and the firing temperature was set to 780° C.

Test Example 6

In Samples 11 to 17 and the standard sample, the freshly-formed surface of the piezoelectric layer 70 in a state in which the second electrode 80 was not formed was observed using a scanning electron microscope (SEM) at a magnification of 50,000. The results of the standard sample are shown in FIG. 16A, and the results of Samples 11 to 17 are shown in FIGS. 16B to 16H.

As a result, it was found that the crystallization was insufficient in Samples 11 and 12 for which the firing temperatures were low, 500° C. and 600° C., and the crystals were collapsed in Sample 17 for which the firing temperature was high, 830° C. In addition, it was found that the crystal grains were excessively grown in Sample 16 for which the firing temperature was 780° C.

Test Example 7

With regard to each of the piezoelectric elements of Samples 11 to 17 and the standard sample, the powder X-ray diffraction patterns of the piezoelectric layers 70 were obtained at room temperature using a "D8 Discover," manufactured by Bruker AXS and CuKα radiation as the X-ray source. The X-ray diffraction patterns, which are views showing the relative relationships between the obtained diffraction intensities and the diffraction angles 2θ, are shown in FIG. 17 (the diffraction intensities are expressed by the logarithms), and the enlarged view of the main portion is shown in FIG. 18.

Figure 18:
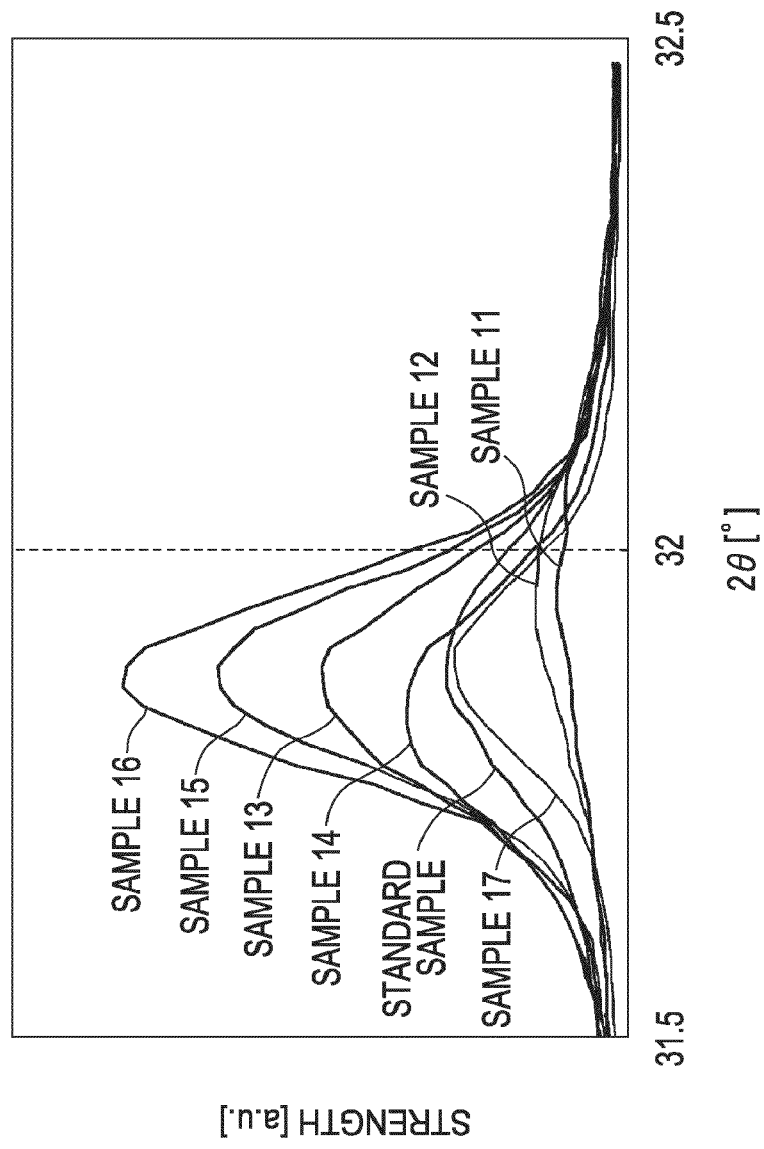
FIG. 18 is an enlarged view of the main portion of the X-ray diffraction pattern.

As a result, as shown in FIGS. 17 and 18, it was found that the peak intensities of (110) were lower in Samples 11 and 12 for which the firing temperatures were low, 500° C. and 600° C., than the standard sample probably because the crystallization was insufficient, the peak intensity of (110) was lower in Sample 17 for which the firing temperature was high, 830° C., than the standard sample probably because the crystals were collapsed, and the firing temperature is preferably 680° C. to 780° C. In addition, it was found that the firing temperature is further preferably 680° C. to 750° C. when the surface morphology of Test example 6 was taken into consideration.

Test Example 8

Figure 19:
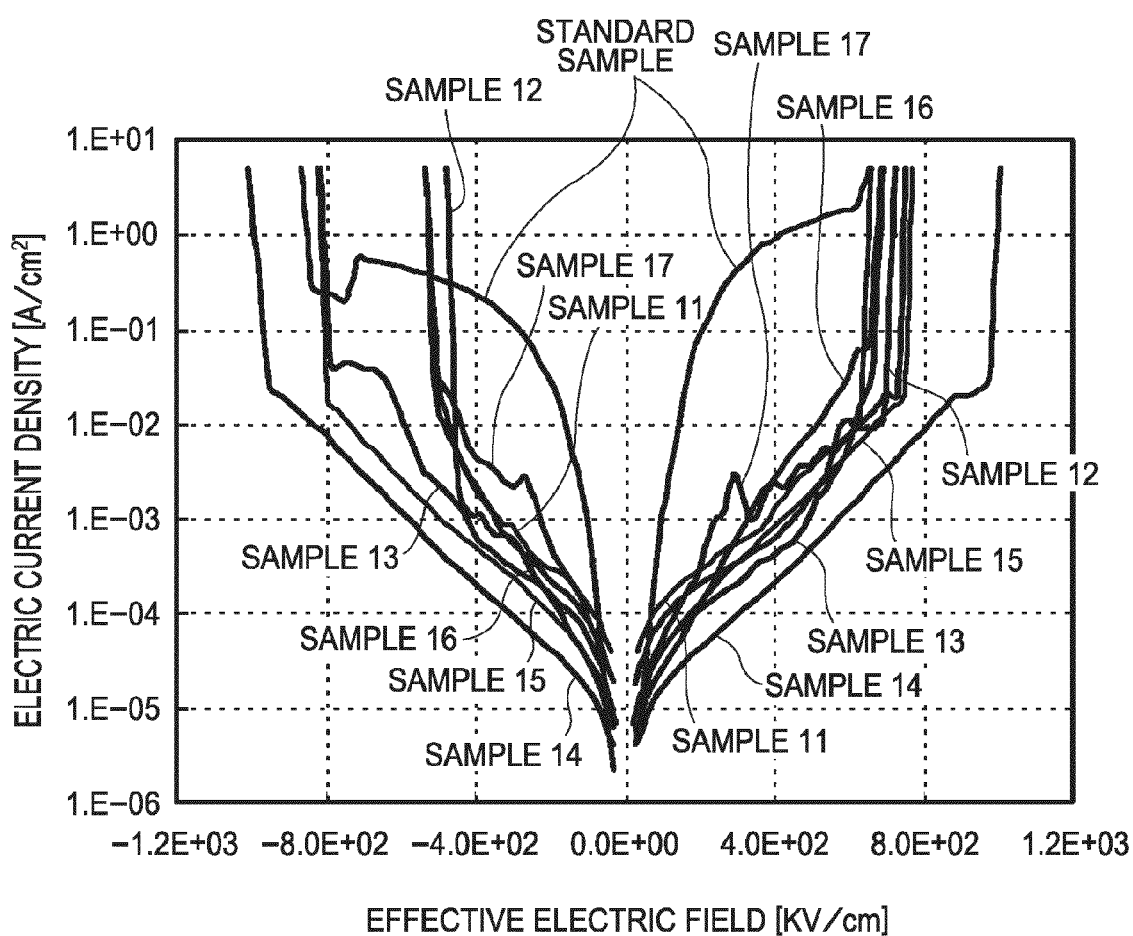
FIG. 19 is a view showing an I-V curves.
Figure 20A:
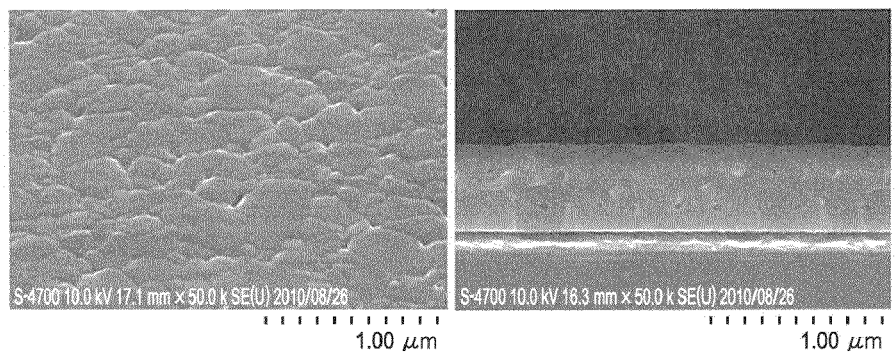
FIG. 20 includes photographs of the surfaces and cross sections of piezoelectric layers which are observed using a SEM.
Figure 20B:
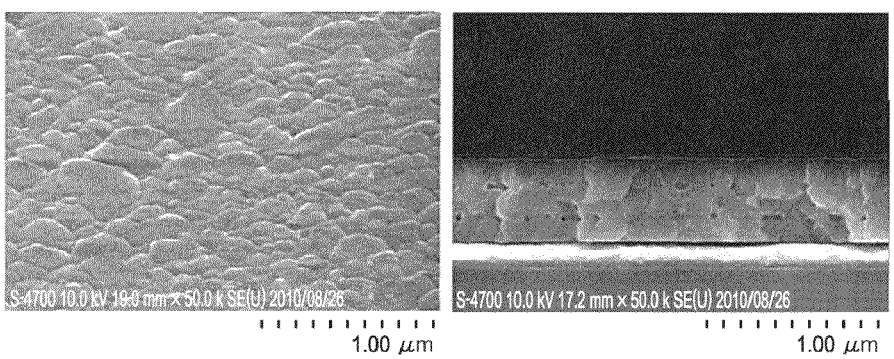
Figure 20C:
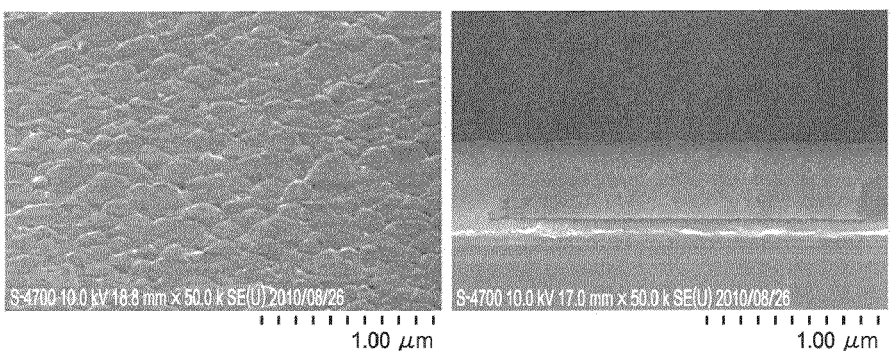
Figure 20D:
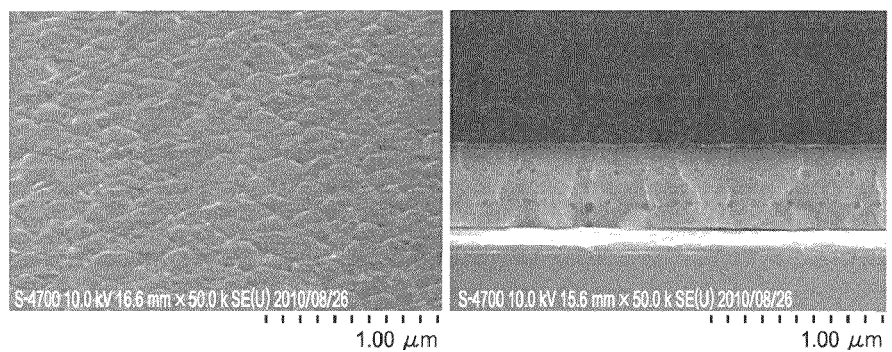
Figure 20E:
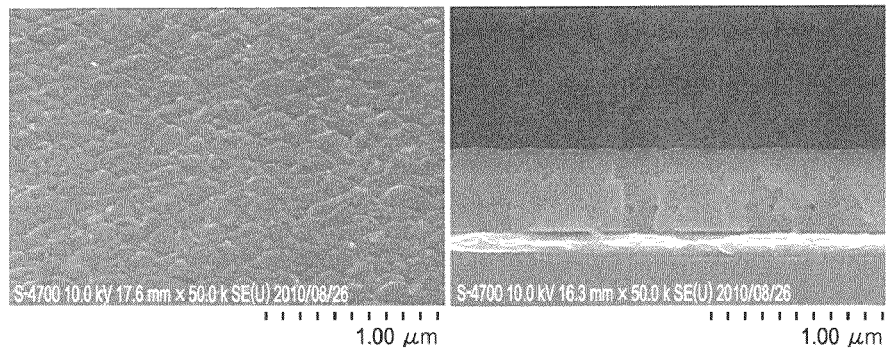

With regard to each of the piezoelectric elements of Samples 11 to 17 and the standard sample, the relationship between the current density and the effective electric field (I-V curve) was obtained by applying a voltage of ±80 V. The results are shown in FIG. 19.

As a result, it was found that, in Sample 11 for which the firing temperature was low, 500° C., the pressure resistance and the leak voltage were low, and the pressure resistance and the leak voltage tend to be increased as the firing temperature is increased. In addition, it was found that the pressure resistance and the leak voltage were more decreased in Sample 16 for which the firing temperature was higher than 750° C., 780° C., than in Sample 15 for which the firing temperature was 750° C., and the pressure resistance and the leak voltage were worst in Sample 17 for which the firing temperature was 830° C. Therefore, it was found that favorable pressure resistance and leak voltage were obtained in Samples 13 to 15 for which the firing temperatures were 680° C. to 750° C.

Samples 21 to 25

Similarly to Example 1, after a 1200 nm-thick silicon dioxide film, a titanium oxide film, and the 130 nm-thick and (111)-oriented first electrode 60 were formed on the surface of a (110) single crystal silicon substrate, the piezoelectric layer 70 was formed on the first electrode 60 by a spin coating method. The method was as follows. Firstly, an octane solution of bismuth 2-ethylhexanoate, a xylene solution of iron 2-ethylhexanoate, an octane solution of barium 2-ethylhexanoate, an octane solution of titanium 2-ethylhexanoate, and an octane solution of cobalt 2-ethylhexanoate were mixed in the predetermined ratios shown in Table 2, thereby preparing a precursor solution. In addition, the precursor solution was dropped on the substrate having the titanium oxide film and the first electrode 60 formed thereon, and the substrate was rotated at 3000 rpm for 20 seconds, thereby forming a piezoelectric precursor film (coating process). Next, the substrate was mounted on a hot plate, and dried at 150° C. for 2 minutes (drying process). Next, the substrate was mounted on the hot plate, and delipidation was carried out at 450° C. for 2 minutes (delipidating process). After the process composed of the coating process, the drying process, and the delipidating process was repeated three times, firing was carried out in an oxygen atmosphere by rapid thermal annealing (RTA) at 700° C. for 5 minutes (firing process). Next, after the process composed of the coating process, the drying process, and the delipidating process was repeated three times, a process in which the firing process for firing in a batch is carried out was repeated three times, and an overall 550 nm-thick piezoelectric layer was formed by coating a total of 9 times.

After that, a 130 nm-thick platinum film was formed on the piezoelectric layer 70 as the second electrode 80 by the DC sputtering method, and then firing was carried out using rapid thermal annealing (RTA) at 700° C. for 5 minutes, thereby forming the piezoelectric element 300 having a complex oxide having the perovskite structure represented by the general formula (1) with a=0.75 and b=0.02 as the piezoelectric layer 70. In addition, the piezoelectric layer 70 was produced by the same operation as the above for Test Example 1 as described below, and was left to stand as it was for 4 days at room temperature (23° C. to 26° C.).

TABLE 2

|  | a | b | Fe:Co:Mn |
|---|---|---|---|
| Sample 21 | 0.75 | 0.02 | 100:2:0 |
| Sample 22 | 0.75 | 0.02 | 100:2:2 |
| Sample 23 | 0.75 | 0.02 | 100:2:5 |
| Sample 24 | 0.75 | 0.02 | 100:2:7 |
| Sample 25 | 0.75 | 0.02 | 100:2:10 |

Test Example 9

In Samples 21 to 25, the freshly-formed surface and cross section of the piezoelectric layer 70 in a state in which the second electrode 80 was not formed were observed using a scanning electron microscope (SEM) at a magnification of 50,000. The results of Samples 21 to 25 are shown in FIGS. 20A to 20E. Meanwhile, in each of the drawings, the left side shows the observation results of the surface, and the right side shows the observation results of the cross section.

As a result, it was found that the crystal grains were decreased in diameter in Sample 22 to which Mn was added at 2% in comparison to Sample 21 to which no Mn was added, the crystal grain diameter tends to become finer as the content of Mn is increased. However, it was found that there was a tendency that the crystal grains were excessively decreased in diameter, and cracking became liable to occur after variation over time in Sample 25 for which the content of Mn was 10%. Therefore, it was found that the content of Mn is preferably 2 mol % to 7 mol % with respect to Fe.

Test Example 10

With regard to each of the piezoelectric elements of Samples 21 to 25, the powder X-ray diffraction patterns of the piezoelectric layers 70 were obtained at room temperature using a "D8 Discover," manufactured by Bruker AXS and CuKαradiation as the X-ray source. The X-ray diffraction patterns, which are views showing the relative relationships between the obtained diffraction intensities and the diffraction angles 2θ, are shown in FIG. 21 (the diffraction intensities are expressed by the logarithms), and the enlarged view of the main portion is shown in FIG. 22.

Figure 21:
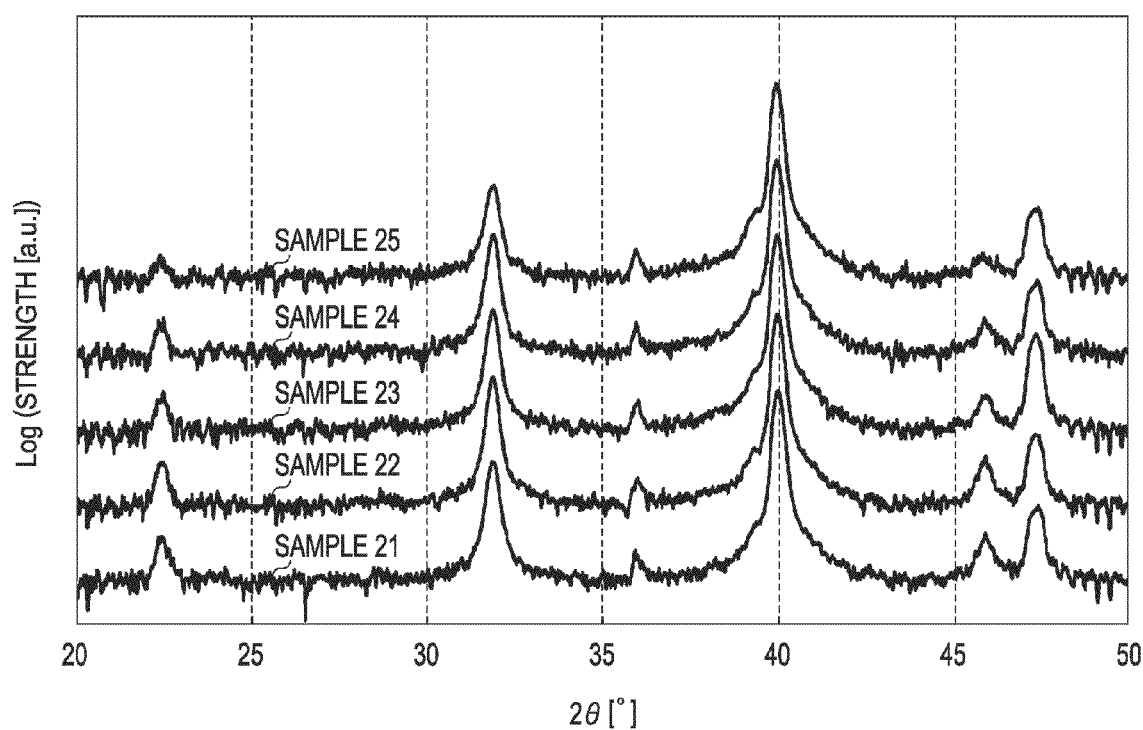
FIG. 21 is a view showing an X-ray diffraction pattern.
Figure 22:
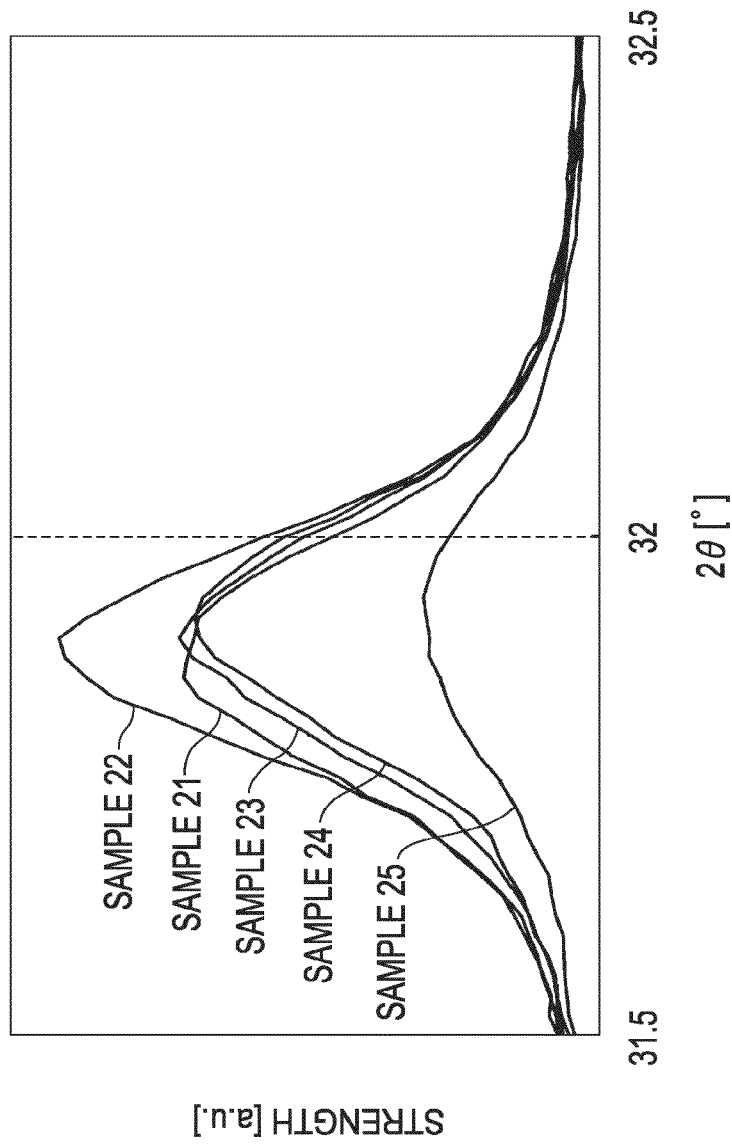
FIG. 22 is an enlarged view of the main portion of the X-ray diffraction pattern.

As a result, as shown in FIGS. 21 and 22, it was found that the crystallinity was improved in Samples 22 to 24 to which Mn was added at 2% to 7% in comparison to Sample 21 to which no Mn was added, but the peak intensity of (110) was degraded in Sample 25 for which the content of Mn was 10%. Therefore, it was found even from the results of the crystallinity that the content of Mn is 2 mol % to 7 mol % with respect to Fe.

Test Example 11

Figure 23:
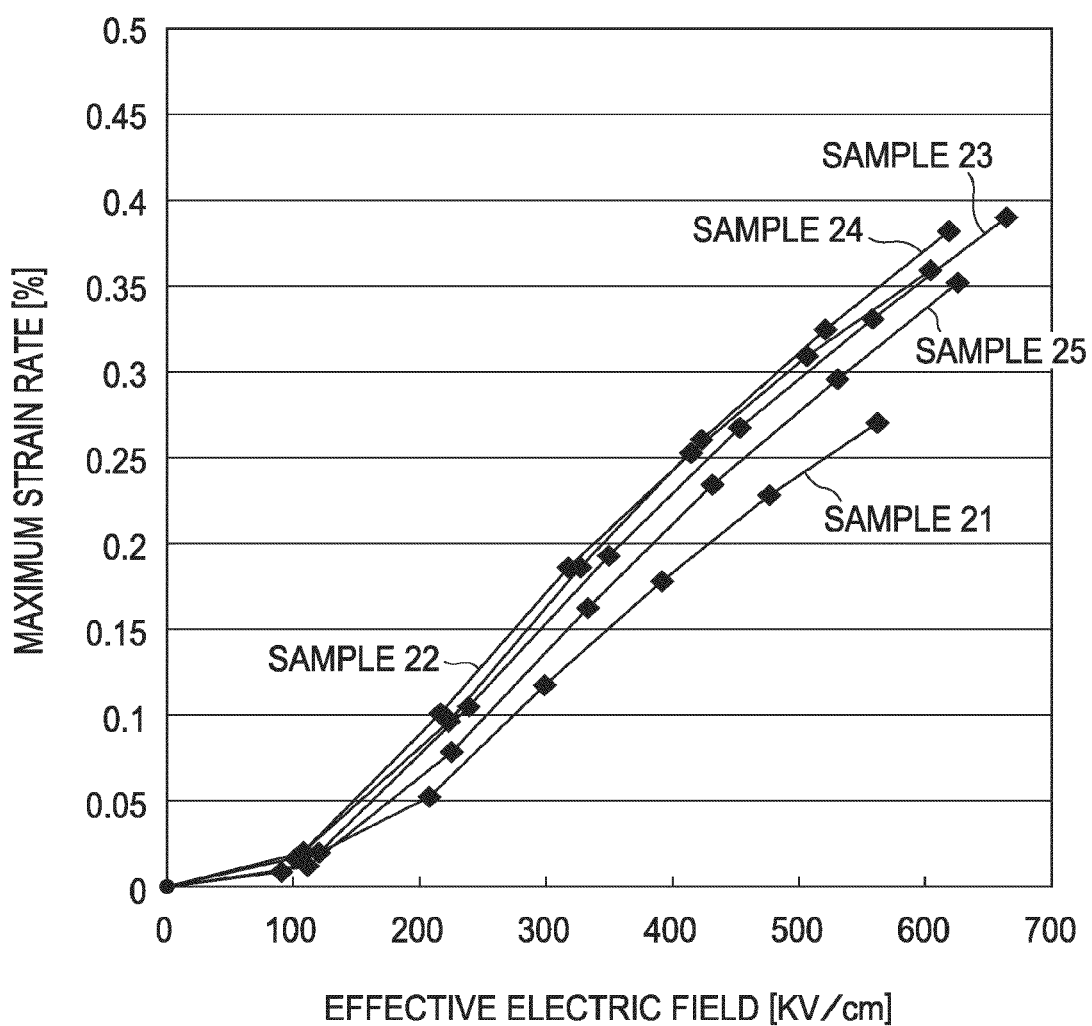
FIG. 23 is a view showing the relationship between the maximum strain rate and the electric field.

With regard to each of the piezoelectric elements of Samples 21 to 25, the relationship between the maximum strain rate and the effective electric field was obtained by applying a voltage with a frequency of 1 kHz using a double beam laser interferometer (DBLI) manufactured by aix-ACCT Systems Inc. and an electrode pattern of φ=500 μm. Meanwhile, the maximum strain rate refers to the strain rate at the most strained place in the piezoelectric layer 70, and the effective electric field refers to the electric field at the most strained place in the piezoelectric layer 70. The results are shown in FIG. 23. As shown in FIG. 23, it was found that the strain rate was large in Samples 22 to 24 to which Mn was added at 2% to 7% in comparison to Sample 21 to which no Mn was added, but the strain rate tended to be decreased when the amount of Mn added exceeded 7%, and therefore the strain rate was decreased in Sample 25 to which Mn was added at 10%. It was also found from this fact that the content of Mn is preferably 2 mol % to 7 mol % with respect to Fe.

Other Embodiments

Thus far, an embodiment of the invention has been described, but the basic configuration of the invention is not limited to the above. For example, the above embodiment exemplified a silicon single crystal substrate as the flow channel-forming substrate 10, but the flow channel-forming substrate is not limited thereto, and, for example, materials, such as an SOI substrate and glass, may be used.

Furthermore, the above embodiment exemplified the piezoelectric element 300 in which the first electrode 60, the piezoelectric layer 70, and the second electrode 80 are sequentially laminated on a substrate (the flow channel-forming substrate 10), but the piezoelectric element is not limited thereto, and, for example, it is possible to apply the invention even to a vertical vibration-type piezoelectric element in which a piezoelectric material and an electrode-forming material are laminated alternately so as to stretch the piezoelectric element in the axis direction.

Figure 24:
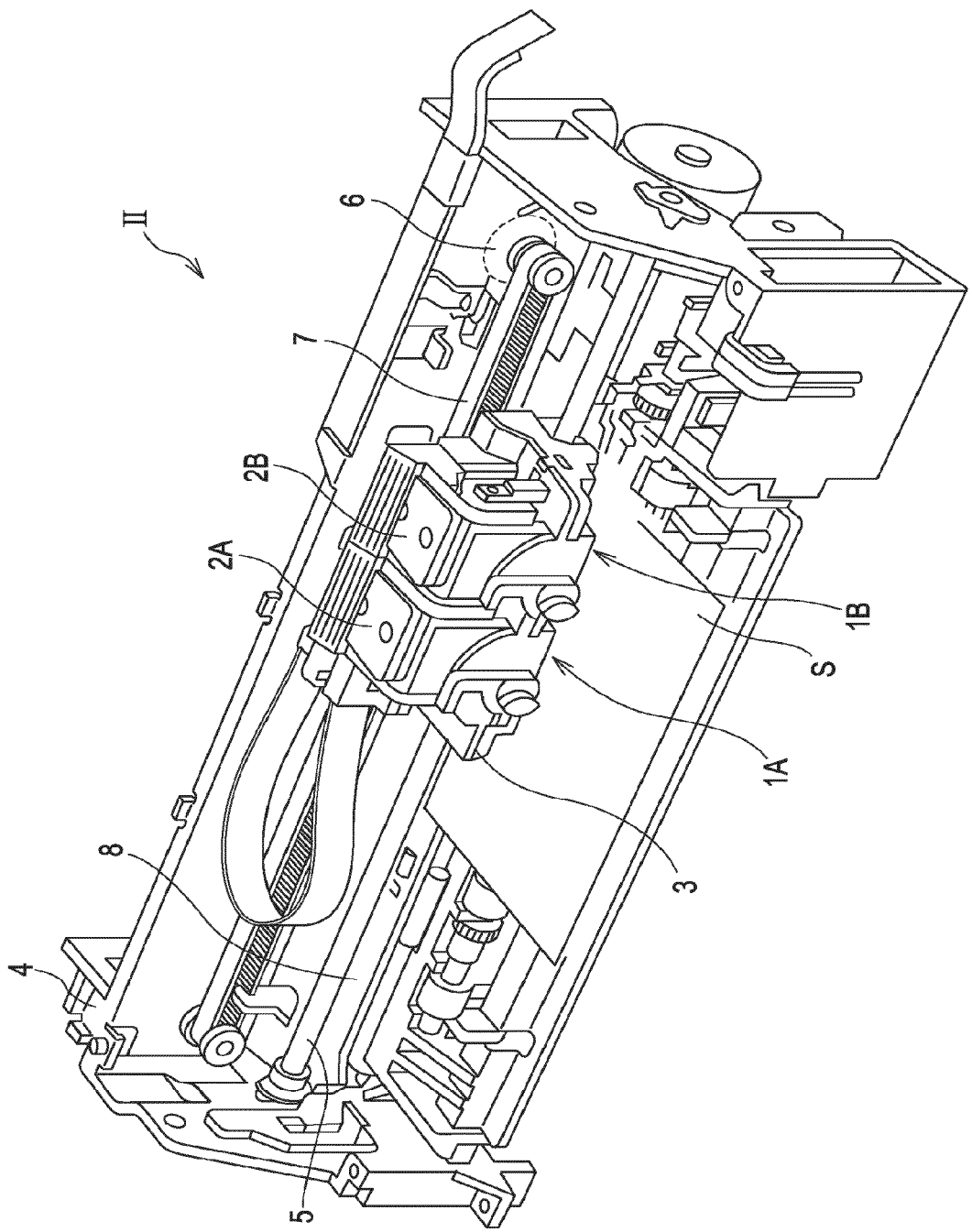
FIG. 24 is a view showing the schematic configuration of the recording apparatus according to the first embodiment of the invention.

In addition, the ink jet-type recording head of the embodiment configures a part of the recording head unit equipped with ink flow channels communicated with an ink cartridge and the like, and is mounted on an ink jet-type recording apparatus. FIG. 24 is a schematic view showing an example of the ink jet-type recording apparatus.

In the ink jet-type recording apparatus II shown in FIG. 24, recording head units 1A and 1B having the ink jet-type recording head I are provided so that cartridges 2A and 2B composing an ink supplying section can be mounted and removed, and a cartridge 3 having the recording head units 1A and 1B mounted thereon is provided so that the cartridge can freely move along the cartridge axis 5 that is attached to an apparatus main body 4. The recording head units 1A and 1B eject a black ink composition and a color ink composition, respectively.

In addition, the cartridge 3 having the recording head units 1A and 1B mounted thereon is moved along the cartridge axis 5 by transmitting the driving force of a driving motor 6 via a plurality of gears, which are not shown, and a timing belt 7. On the other hand, a platen 8 is provided along the cartridge axis 5 in the apparatus main body 4, and a recording sheet S, which is a recording medium, such as paper supplied by a paper supplying roller or the like, which is not shown, is rolled on the platen 8 and transported.

Meanwhile, the above embodiment exemplified the ink jet-type recording head as an example of the liquid ejecting head, but the invention can be applied to an entire range of liquid ejecting heads, and, naturally, can be applied even to liquid ejecting heads that eject liquid other than ink. Examples of other liquid ejecting heads include a variety of recording heads that are used in an image recording apparatus, such as a printer, color material ejecting heads used to manufacture color filters, such as liquid crystal displays, electrode material ejecting heads used to form electrodes, such as organic EL displays, field emission displays (FED), biological organic substance ejecting heads used to manufacture bio chips, and the like.

In addition, the invention is not limited to piezoelectric elements mounted in liquid ejecting heads that are represented by the ink jet-type recording head, and can be applied to piezoelectric elements mounted in apparatuses, such as ultrasonic communicators and other ultrasonic devices, ultrasonic motors, piezoelectric sensors that detect deformation of a piezoelectric layer as an electric signal, pressure sensors, IR sensors, and other pyroelectric elements. In addition, the invention can be similarly applied to ferroelectric elements, such as ferroelectric memories.

What is claimed is:

1. A piezoelectric element, comprising
a piezoelectric layer; and
electrodes provided to the piezoelectric layer,
wherein the piezoelectric layer has a perovskite structure that includes Bi, Fe, Ba, Ti, and Co, and a mole ratio of Co to the total amount of Co and Fe is 0.02 or more and 0.07 or less and a general formula of the piezoelectric layer is:

$$[a\{Bi(Fe_{1-b}Co_b)O_3\}-(1-a)\{BaTiO_3\}],$$

wherein $0.6 \leq a \leq 0.9$.

2. The piezoelectric element according to claim 1, wherein the mole ratio of Co to the total amount of Co and Fe is 0.02 or more and 0.05 or less.

3. The piezoelectric element according to claim 1, wherein the mole ratio of Co to the total amount of Co and Fe is 0.05 or more and 0.07 or less.

4. The piezoelectric element according to claim 1, wherein the perovskite structure further includes Mn.

5. A liquid ejecting head, comprising the piezoelectric element according to claim 1.

6. A liquid ejecting apparatus, comprising the liquid ejecting head according to claim 5.

* * * * *